US012640741B2

(12) United States Patent
Wu et al.

(10) Patent No.: US 12,640,741 B2
(45) Date of Patent: May 26, 2026

(54) SYSTEM AND METHOD FOR PHASE ALIGNMENT BETWEEN MULTIPLE PHASE-LOCKED LOOPS CIRCUITS

(71) Applicant: Movandi Corporation, Irvine, CA (US)

(72) Inventors: Stephen Wu, Fountain Valley, CA (US); Hani Esmaeelzadeh, Irvine, CA (US); Farid Shirinfar, Granada Hills, CA (US); Brima Ibrahim, Laguna Hills, CA (US); Sina Basir-Kazeruni, Irvine, CA (US)

(73) Assignee: Movandi Corporation, Irvine, CA (US)

( * ) Notice: Subject to any disclaimer, the term of this patent is extended or adjusted under 35 U.S.C. 154(b) by 30 days.

(21) Appl. No.: 18/939,580

(22) Filed: Nov. 7, 2024

(65) Prior Publication Data

US 2025/0330181 A1    Oct. 23, 2025

Related U.S. Application Data

(60) Provisional application No. 63/636,505, filed on Apr. 19, 2024.

(51) Int. Cl.
*H03L 7/07* (2006.01)
*H03L 7/085* (2006.01)

(52) U.S. Cl.
CPC ................ *H03L 7/07* (2013.01); *H03L 7/085* (2013.01)

(58) Field of Classification Search
CPC .................................. H03L 7/07; H03L 7/085
USPC .................................................... 327/157, 158
See application file for complete search history.

(56) References Cited

U.S. PATENT DOCUMENTS

| | | | |
|---|---|---|---|
| 7,463,710 B2 | 12/2008 | Walsh et al. | |
| 11,743,026 B2 | 8/2023 | Sridharan et al. | |
| 2014/0320173 A1 | 10/2014 | Cloutier et al. | |
| 2017/0179966 A1* | 6/2017 | Zhang | H03L 7/0891 |
| 2024/0275392 A1* | 8/2024 | Sjöland | H03L 7/093 |

* cited by examiner

*Primary Examiner* — Tomi Skibinski
(74) *Attorney, Agent, or Firm* — CHIP LAW GROUP

(57) ABSTRACT

A system and a method for phase alignment between multiple phase-locked loops (PLL) circuits is provided. The system determines phase difference information between a first output signal of one of a plurality of PLL circuits and a second output signal of other of the plurality of PLL circuits. The system further determines control information based on the determined phase difference information and controls at least one of a reference buffer, a phase detector and charge pump, a phase shifter, or a delta sigma (ΔΣ) modulator of the one of the plurality of PLL circuits based on the determined control information. The system further controls phase alignment between the first output signal and the second output signal based on the control of the at least one of the reference buffer, the phase detector and charge pump, the phase shifter, or the delta sigma (ΔΣ) modulator.

20 Claims, 9 Drawing Sheets

800

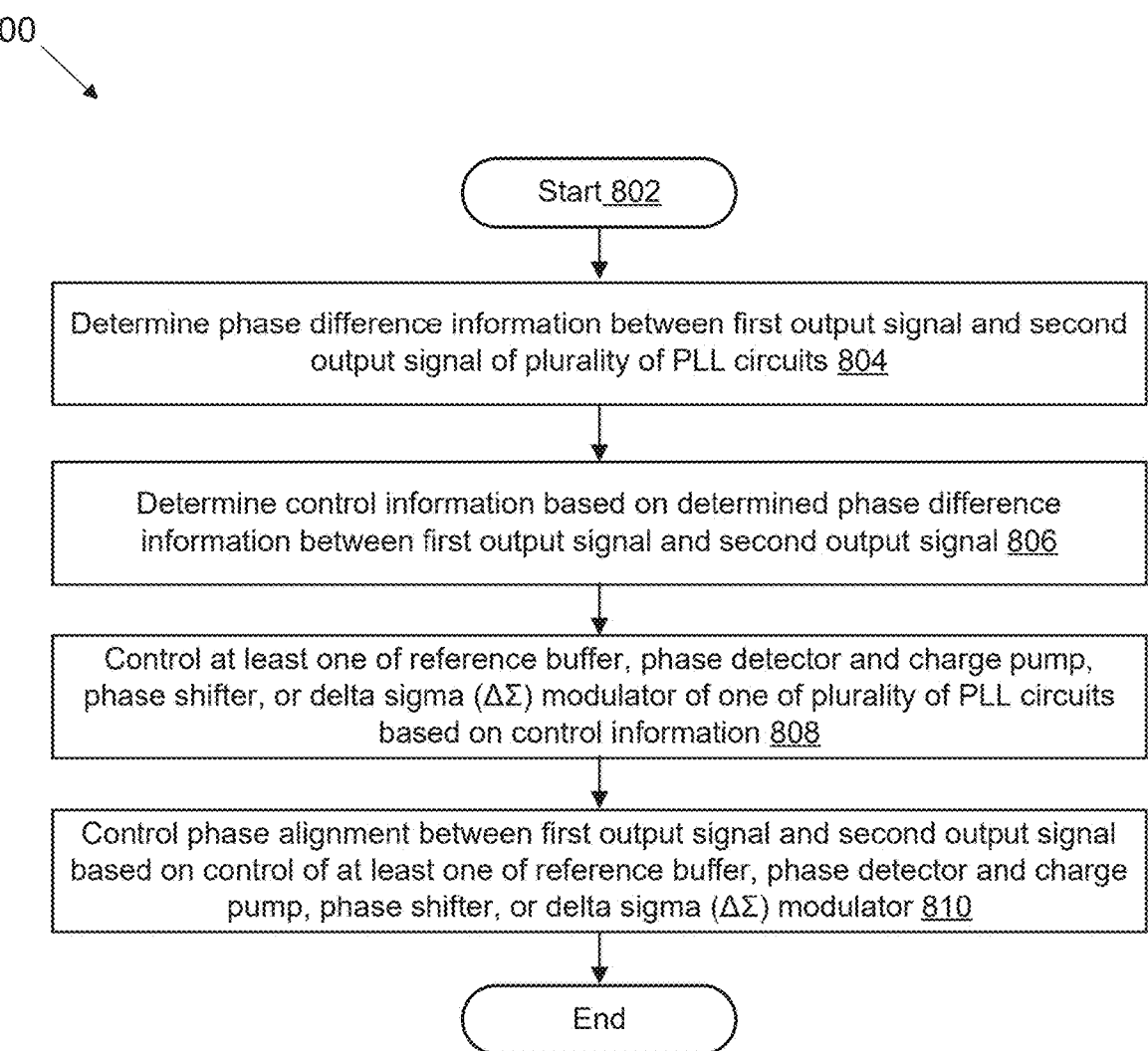

Start 802

Determine phase difference information between first output signal and second output signal of plurality of PLL circuits 804

Determine control information based on determined phase difference information between first output signal and second output signal 806

Control at least one of reference buffer, phase detector and charge pump, phase shifter, or delta sigma (ΔΣ) modulator of one of plurality of PLL circuits based on control information 808

Control phase alignment between first output signal and second output signal based on control of at least one of reference buffer, phase detector and charge pump, phase shifter, or delta sigma (ΔΣ) modulator 810

End

FIG. 8

SYSTEM AND METHOD FOR PHASE ALIGNMENT BETWEEN MULTIPLE PHASE-LOCKED LOOPS CIRCUITS

CROSS-REFERENCE TO RELATED APPLICATIONS/INCORPORATION BY REFERENCE

This application claims priority to U.S. Provisional Patent Application No. 63/636,505 filed on Apr. 19, 2024, the entire content of which is hereby incorporated herein by reference.

FIELD OF TECHNOLOGY

Various embodiments of the disclosure relate to phase-locked loop (PLL) circuits. More specifically, various embodiments of the disclosure relate to a system and method for phase alignment between multiple phase-locked loop (PLL) circuits or outputs.

BACKGROUND

Recent advancements in the field of wireless communication have led to development of various techniques related to phase-locked loop (PLL) modules or circuits. Typically, the phase locked loop (PPL) circuit is used to stabilize the output frequency of voltage controlled oscillators (VCO) based on a stable reference frequency signal and a feedback based mechanism. The PLL circuits are used in variety of applications, for example, but not limited to, wireless communication, RF devices, FM demodulators, frequency synthesizers, signal reconstructions, clock recovery and synchronization circuits, local oscillators, etc. Different applications may also require an implementation of multiple PLL circuits, however, due to certain situations (like temperature variations, input voltage variations, ambient noise, environmental conditions, systematic or random mismatch between components of different PLL circuits, or ageing issues), output phases of such multiple PLL circuits are not aligned which may impact the corresponding application to certain extent. Therefore, there may be a need for an intelligent system which may align the phases between the outputs of multiple PLL circuits without an impact of such situations.

Further limitations and disadvantages of conventional and traditional approaches will become apparent to one of skill in the art, through comparison of such systems with some aspects of the present disclosure as set forth in the remainder of the present application with reference to the drawings.

SUMMARY

A system and a method for implementation of phase alignment between multiple phase-locked loop (PLL) circuits, are provided substantially as shown in and/or described in connection with at least one of the figures, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

FIG. 8 is a flowchart that illustrates exemplary operations for phase alignment between multiple phase-locked loop (PLL) circuits, in accordance with an embodiment of the disclosure.

DETAILED DESCRIPTION

Figure 1:
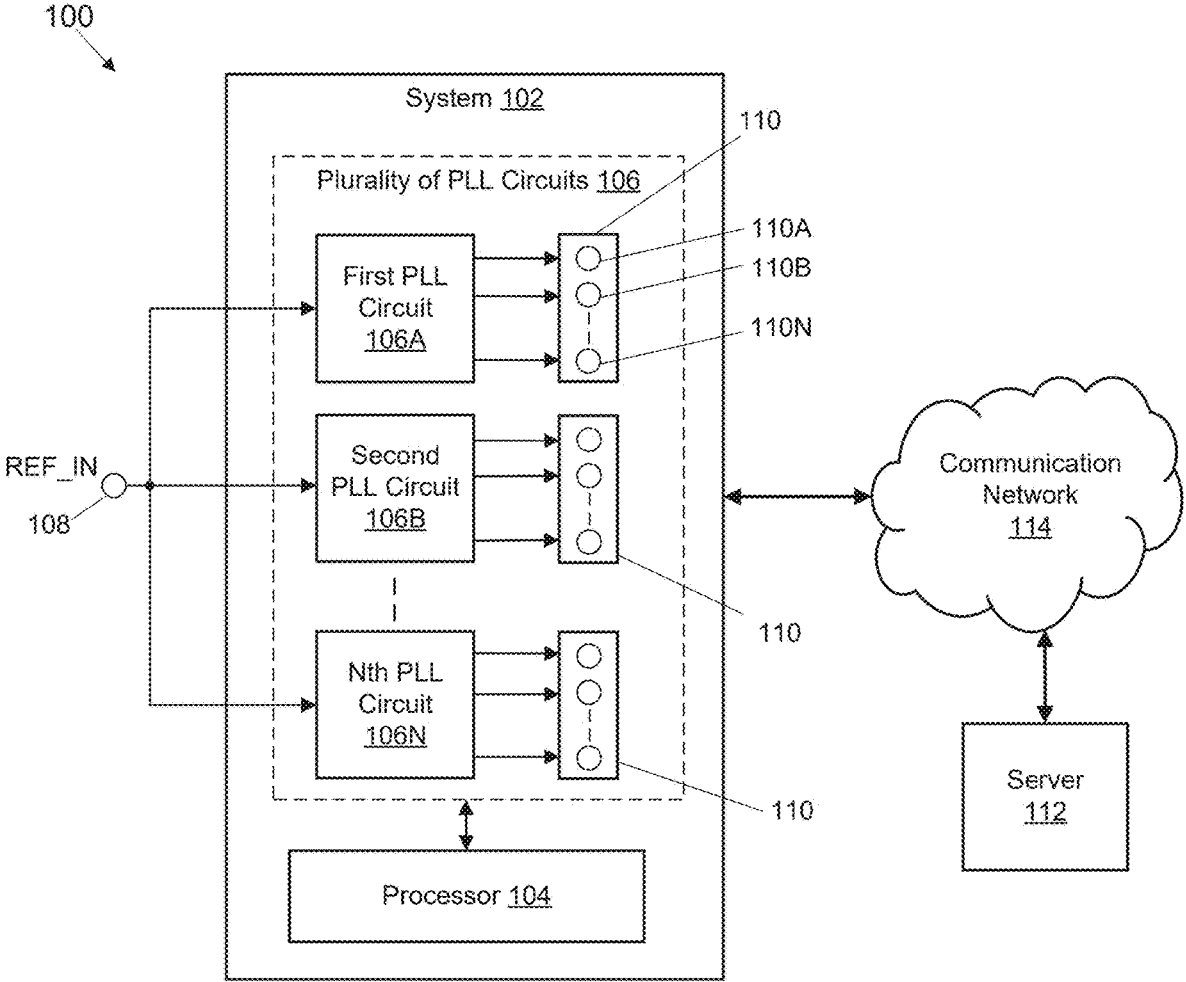
FIG. 1 is a diagram of an exemplary network environment including a system for phase alignment between multiple phase-locked loop (PLL) circuits, in accordance with an embodiment of the disclosure.

The following described implementations may be found in a disclosed system, an electronic device and a method for automated phase alignment between multiple phase-locked loop (PLL) circuits/outputs. Exemplary aspects of the disclosure provide a system that may include a plurality of PLL circuits, where each of the plurality of PLL circuits may at least include a reference buffer, a phase detector and charge pump, a phase shifter, and a delta sigma ($\Delta\Sigma$) modulator and each of the plurality of PLL circuits may receive a reference frequency signal (for example a stable reference clock signal) and output a plurality of output signals. The system 102 may further include at least one processor that may be configured to perform an intelligent and an automated search process to accurately align the phase between outputs of the plurality of PLL circuits irrespective of different mismatch between the PLL circuits or various conditions (like temperature or input voltage changes, operating frequency changes, ageing of components, noise, etc.). The system may be configured to determine phase difference between two corresponding output signals (for example a first output signal and a second output signal) of different PLL circuits. The phase difference may be determined based on average power of combined output signals. The system may further determine control information based on the search process where the control information may be determined based on the phase difference determined between the outputs signals of the multiple PLL circuits (like two PLL circuits). The system may perform the search process using internally stored lookup tables which may store relationships between different values of the phase difference and the control information. The system may determine the control information based on incremental or step wise search (like linear search or binary search) being conducted using the stored look-up tables. The control information may correspond to time delay information or different characteristic information related to different programmable registers or components of the PLL circuits. The system may be further configured to control at least one of the registers/components (like a reference buffer, a phase detector and charge pump, a phase shifter, and a delta sigma ($\Delta\Sigma$) modulator) of at least one of the plurality of PLL circuits based on the determined control information. The control of at least one of the registers/components of at least one of the PLL circuits may adjust the phase of corresponding output signals and may further control the phase alignment between the first output signal and the second output signal of different PLL circuits. In an embodiment, the system may control the phase alignment (i.e. based on the determination of the phase difference, the control information, and the control of one of the registers) in one or more search steps until the phase of the two output signals (like the first output signal and the second output signal) are completely aligned or average power of their combined signals is maximum. The phase alignment between the output signals of the PLL circuits may be performed during a calibration phase of the system or of any device including the PLL circuits. In an embodiment, the system may trigger the phase alignment process (using the search process) between output signals of at least two PLL circuits either manually, continuously, periodically, or based on changes of certain parameters (like, but not limited to, operating temperature, frequency, voltages) over a defined threshold. Therefore, either during the calibration or during an operational phase of the system, the phases between outputs of multiple PLL circuits are accurately aligned.

FIG. 1 is a diagram of an exemplary network environment including a system for phase alignment between multiple phase-locked loop (PLL) circuits, in accordance with an embodiment of the disclosure. With reference to FIG. 1, there is shown a network environment 100. The network environment 100 may include a system 102 which may further include a processor 104 and a plurality of phase-locked loop (PLL) circuits 106, for example a first PLL circuit 106A, a second PLL circuit 106B, and Nth PLL circuit 106N as shown in FIG. 1. Each of the plurality of PLL circuits 106 may receive a reference frequency signal 108 ("REF_IN") and output a plurality of output signals 110 (like a first output signal 110A, a second output signal 110B, and Nth output signal 110N). The network environment 100 may further include a server 112 communicably coupled with the system 102 via a communication network 114.

In FIG. 1, the system 102 may include the plurality of PLL circuits 106. In an embodiment, the system 102 may be communicably coupled with the plurality of PLL circuits 106. Further, the system 102 and the server 112 are shown as two separate devices; however, in some embodiments, the entire functionality of the server 112 may be included in the system 102, without a deviation from scope of the disclosure. "N" number of PLL circuits (i.e. the first PLL circuit 106A, the second PLL circuit 106B, and Nth PLL circuit 106N) shown in FIG. 1 is presented merely as an example. The plurality of PLL circuits 106 may include only two PLL circuits, without deviation from the scope of the disclosure.

The system 102 may comprise a suitable logic, circuitry, interfaces, and/or code that may be configured to control phase alignment between output signals of the plurality of PLL circuits 106. The system 102 may determine the phase difference information between output signals of the plurality of PLL circuits 106 as further described, for example, in FIG. 4 (at step 402). The system 102 may further determine the control information based on the determined phase difference information as further described, for example, in FIG. 4 (at step 404). The system 102 may further control at least one of the registers/components (like the reference buffer, the phase detector and charge pump, the phase shifter, or the delta sigma ($\Delta\Sigma$) modulator) of one of the plurality of PLL circuits 106 based on the determined control information as further described, for example, in FIG. 4 (at step 406). The system 102 may further control the phase alignment between the output signals of the plurality of PLL circuits 106 based on the control of at least one of the programmable registers/components of one of the plurality of PLL circuits 106 as further described, for example, in FIG. 4 (at step 408). Examples of the system 102 may include, but are not limited to, a calibration device, a FM demodulator, a frequency synthesizer, a radio receiver device, a wireless device, a computing device, a controller system, a server, a mainframe machine, a computer workstation, a smartphone, a cellular phone, a mobile phone, and/or a consumer electronic (CE) device.

The processor 104 may include suitable logic, circuitry, interfaces and/or code that may be configured to execute program instructions associated with different operations to be executed by the system 102. For example, some of the operations may include, but not limited to, determination of the phase difference information, determination of the control information, control of different components of the plurality of PLL circuits 106, control of phase alignment between multiple PLL circuits, or control time synchronization between the plurality of PLL circuits 106. The processor 104 may include one or more specialized processing units, which may be implemented as a separate processor. In an embodiment, the one or more specialized processing units may be implemented as an integrated processor or a cluster of processors that perform the functions of the one or more specialized processing units, collectively. The processor 104 may be implemented based on a number of processor technologies known in the art. Examples of implementations of the processor 202 may be an X86-based processor, a Graphics Processing Unit (GPU), a Reduced Instruction Set Computing (RISC) processor, an Application-Specific Integrated Circuit (ASIC) processor, a Complex Instruction Set Computing (CISC) processor, a microcontroller, a central processing unit (CPU), and/or other control circuits.

Figure 3:
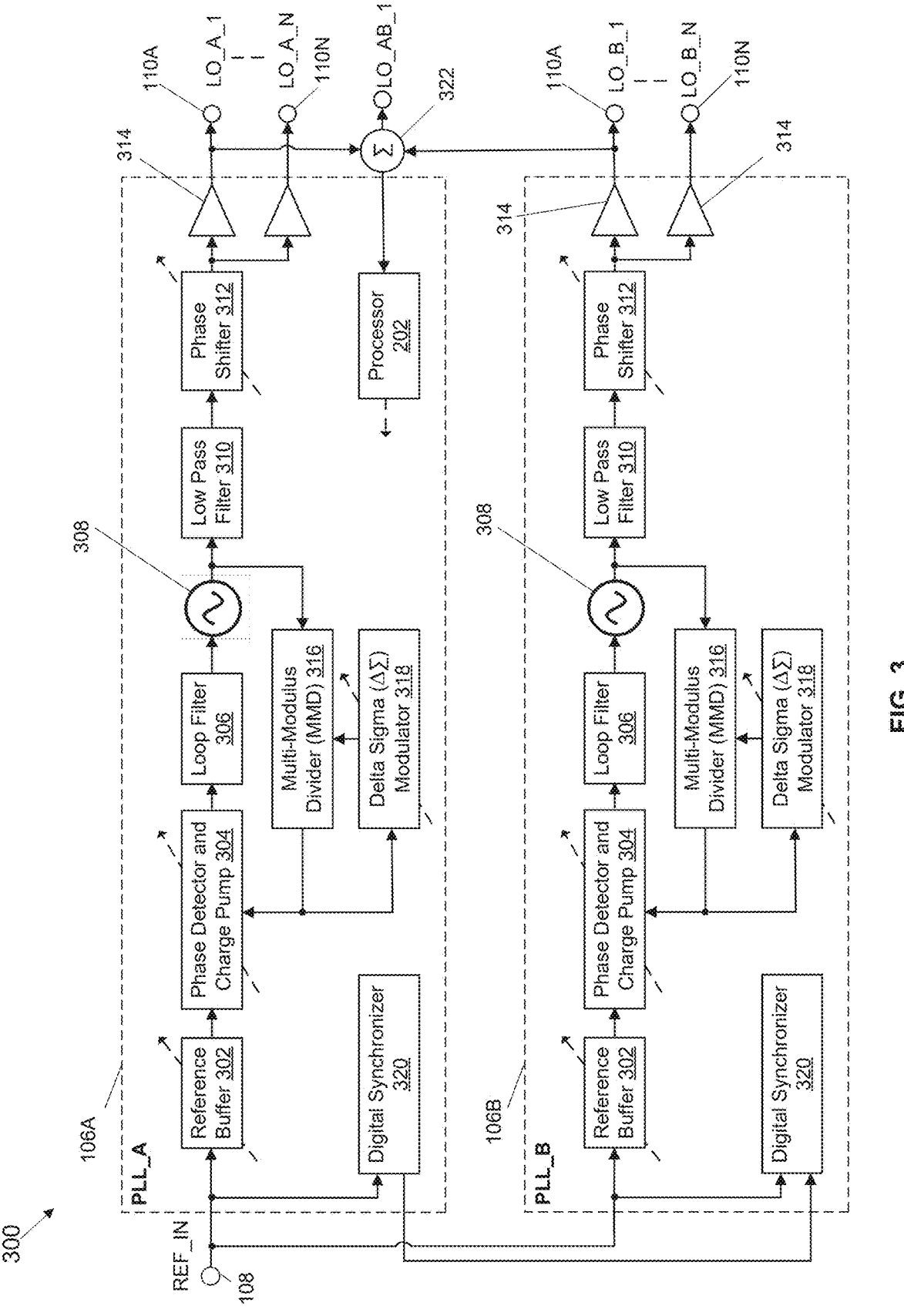
FIG. 3 is an exemplary block diagram that illustrate multiple PLL circuits for the phase alignment, in accordance with an embodiment of the disclosure.

Each of the plurality of PLL circuits 106 may comprise a suitable logic, circuitry, or interfaces that may be configured to synchronize the frequency and the phase of an output signal (like each of the plurality of output signals 110) of the corresponding PLL with respect to the reference frequency signal 108. The PLL circuit may compare the phase and the frequency of the output signal with the phase and frequency of the reference frequency signal 108, and then adjust the frequency of the output signal until the both phases are synchronized. Each of the plurality of PLL circuits 106 may at least include components like a phase detector, a low-pass filter, and a voltage-controlled oscillator (VCO) as shown in FIG. 3. The phase detector may compare the phase of the output signal with the phase of the reference frequency signal 108, and may produce an error signal that may be proportional to the phase difference. The low-pass filter may smooth out the error signal based on removal of high frequency components and further send the smoothen error signal (as voltage) to the VCO, which may further adjust the frequency of the output signal based on the voltage based error signal until the phase difference is minimized. This process may continue until the two signals are in perfect synchronization. The PLL circuit may include a feedback system (like a frequency divider i.e. the combination of multi-modulus divider (MMD) and a delta sigma modulator shown in FIG. 3) that may connect the VCO with the phase detector so that the VCO may maintain a constant phase angle relative to the reference frequency signal 108. The feedback system may divide the frequency of the output signal by a fixed factor to produce a feedback signal that may be fed in the phase detector. Different components of each of the plurality of PLL circuits 106 are further described, for example, in FIG. 3. Each of the plurality of PLL circuits 106 may be used to generate a stable output high frequency signal from a fixed low-frequency reference signal irrespective of any impact due to temperature change and/or noise.

Figure 4:
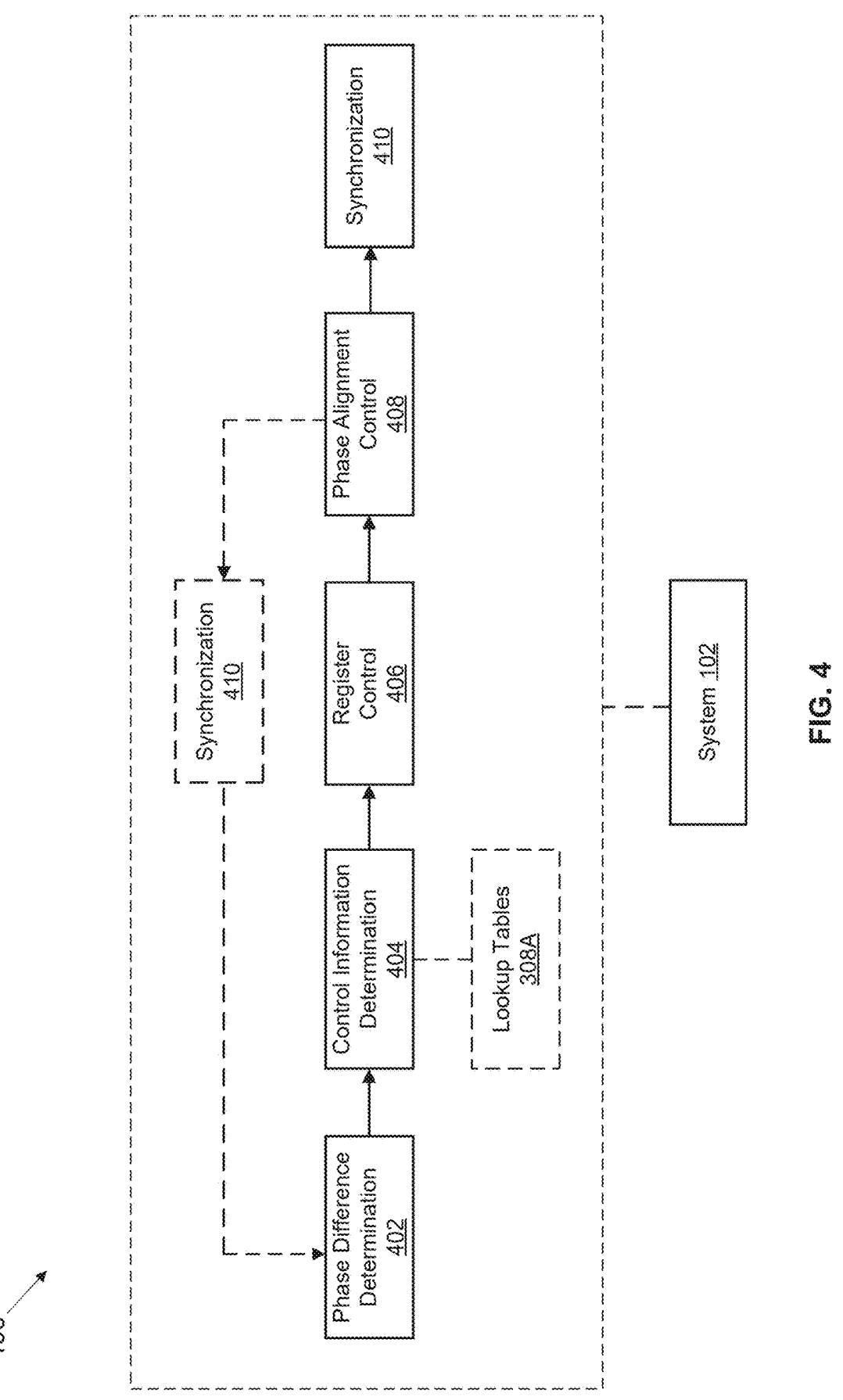
FIG. 4 is a diagram that illustrates exemplary operations performed by the system of FIG. 1 for phase alignment between multiple phase-locked loop (PLL) circuits, in accordance with an embodiment of the disclosure.

The server 112 may include suitable logic, circuitry, and interfaces, and/or code that may be configured to store look-up table (as shown in FIG. 4) that may be utilized to determine the control information based on the phase difference information. In an embodiment, the server 112 may be configured to store threshold information for the phase difference information to control the phase alignment between multiple PLL circuits. In some embodiments, the server 112 may store the time interval based on which the phase alignment process between multiple PLL circuits may be triggered periodically. The server 112 may be communicate with the system 102 to provide any requested information for the automated phase alignment between multiple PLL outputs/circuits. The server 112 may be implemented as a cloud server and may execute operations through web applications, cloud applications, HTTP requests, repository operations, file transfer, and the like. Other example implementations of the server 112 may include, but are not limited to, a database server, a file server, a web server, a media server, an application server, a mainframe server, or a cloud computing server. In at least one embodiment, the server 112 may be implemented as a plurality of distributed cloud-based resources by use of several technologies that are well known to those ordinarily skilled in the art. A person with ordinary skill in the art will understand that the scope of the disclosure may not be limited to the implementation of the server 112 and the system 102 as two separate entities. In certain embodiments, the functionalities of the server 112 can be incorporated in its entirety or at least partially in the system 102, without a departure from the scope of the disclosure.

The communication network 114 may include a communication medium through which the system 102 and the server 120 may communicate with each other. The communication network 114 may be one of a wired connection or a wireless connection Examples of the communication network 114 may include, but are not limited to, the Internet, a cloud network, a Wireless Fidelity (Wi-Fi) network, a Personal Area Network (PAN), a Local Area Network (LAN), or a Metropolitan Area Network (MAN). Various devices in the network environment 100 may be configured to connect to the communication network 114 in accordance with various wired and wireless communication protocols. Examples of such wired and wireless communication protocols may include, but are not limited to, at least one of a Transmission Control Protocol and Internet Protocol (TCP/IP), User Datagram Protocol (UDP), Hypertext Transfer Protocol (HTTP), File Transfer Protocol (FTP), Zig Bee, EDGE, IEEE 802.11, light fidelity (Li-Fi), 802.16, IEEE 802.11s, IEEE 802.11g, multi-hop communication, wireless access point (AP), device to device communication, mobile/cellular communication protocols, and Bluetooth (BT) communication protocols.

In some embodiments, the communication network 114 may correspond to a wireless network that may include a medium through which two or more wireless nodes may communicate with each other. Also, the wireless network may include a medium through which the server 112 and/or other network-related devices in the wireless network may provide communication with each other. The wireless network may be established in accordance with Institute of Electricals and Electronics Engineers (IEEE) standards for infrastructure mode (Basic Service Set (BSS) configurations), or in some specific cases, in ad hoc mode (Independent Basic Service Set (IBSS) configurations). The wireless network may be a Wireless Sensor Network (WSN), a Mobile Wireless Sensor Network (MWSN), a wireless ad hoc network, a Mobile Ad-hoc Network (MANET), a Wireless Mesh Network (WMN), a Wide Area Network (WAN), a Wireless Local Area Network (WLAN), a cellular network, a Long Term Evolution (LTE) network, an Evolved High Speed Packet Access (HSPA+), a 3G network, a 4G network, a 5G network, and the like. The wireless network may operate in accordance with IEEE standards, such as 802 wireless standards or a modified protocol, which may include, but are not limited to, 802.3, 802.15.1, 802.16 (Wireless local loop), 802.20 (Mobile Broadband Wireless Access (MBWA)), 802.11-1997 (legacy version), 802.15.4, 802.11a, 802.11b, 802.11g, 802.11e, 802.11i, 802.11f, 802.11c, 802.11h (specific to European regulations) 802.11n, 802.11j (specific to Japanese regulations), 802.11p, 802.11ac, 802.11ad, 802.11ah, 802.11aj, 802.11ax, 802.11ay, 802.11az, 802.11 hr (high data rate), 802.11af (white space spectrum), 802.11-2007, 802.11-2008, 802.11-2012, 802.11-2016.

Figure 2:
FIG. 2 is a block diagram that illustrates a system of FIG. 1 for phase alignment between multiple phase-locked loop (PLL) circuits, in accordance with an embodiment of the disclosure.
Figure 2:
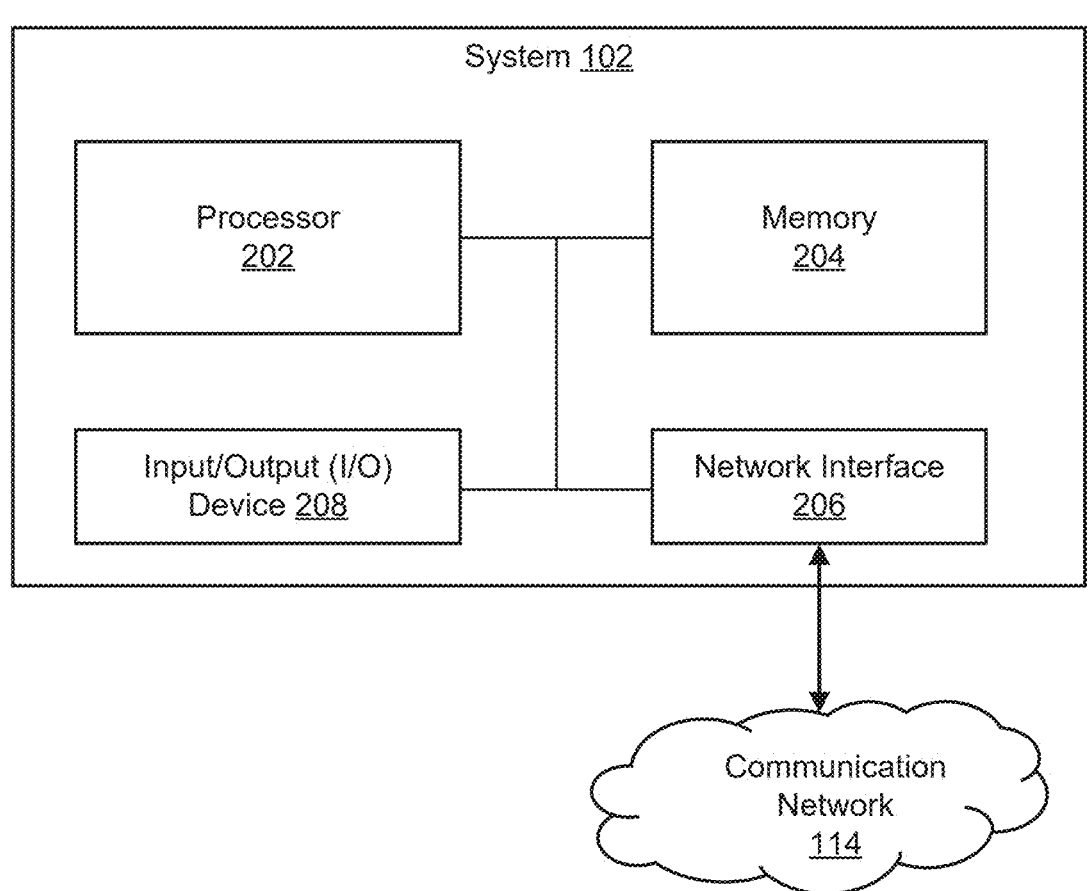

FIG. 2 is a block diagram that illustrates a system of FIG. 1 for phase alignment between multiple phase-locked loop (PLL) circuits, in accordance with an embodiment of the disclosure. FIG. 2 is explained in conjunction with elements from FIG. 1. With reference to FIG. 2, there is shown a block diagram 200 of the system 102 that may be coupled to the server 112, via the communication network 114. The system 102 may further include a processor 202, a memory 204, a network interface 206, and Input/output (1/O) device 208. The system 102 may connect to the communication network 114, via the network interface 206.

The processor 202 may include suitable logic, circuitry, interfaces and/or code that may be configured to execute program instructions associated with different operations to be executed by the system 102. The functions of the processor 202 may be same as the functions of the processor 104 described, for example, in FIG. 1. Therefore, the description of the processor 202 is omitted from the disclosure for the sake of brevity.

The memory 204 may comprise suitable logic, circuitry, interfaces and/or code that may be configured to store the phase difference information and the control information. The memory 204 may further store different look-up tables to store the relationship between different phase difference values and the control information for different programmable components of each of the plurality of PLL circuits 106. The memory 204 may be further configured to store different information (like operating temperature, operating voltage, etc) based on which the phase alignment process may be triggered by the system 102. In some embodiments, the memory 204 may be configured to store phase difference threshold to control the phase alignment process. Examples of implementation of the memory 204 may include, but are not limited to, Random Access Memory (RAM), Read Only Memory (ROM), Electrically Erasable Programmable Read-Only Memory (EEPROM), Hard Disk Drive (HDD), a Solid-State Drive (SSD), a CPU cache, and/or a Secure Digital (SD) card.

The network interface 206 may comprise suitable logic, circuitry, interfaces, and/or code that may be configured to facilitate communication with the server 112, with other on-chip circuits, or with other network devices, via the communication network 114. The network interface 206 may be implemented by use of various known technologies to support wired or wireless communication of the server 112 with the communication network 114. The network interface 206 may include, but is not limited to, an antenna, a radio frequency (RF) transceiver, one or more amplifiers, a tuner, one or more oscillators, a digital signal processor, a coder-decoder (CODEC) chipset, a subscriber identity module (SIM) card, or a local buffer circuitry.

The network interface 206 may be configured to communicate via wireless communication with networks, such as the Internet, an Intranet, a wireless network, a cellular telephone network, a wireless local area network (LAN), or a metropolitan area network (MAN). The wireless communication may be configured to use one or more of a plurality of communication standards, protocols and technologies, such as Global System for Mobile Communications (GSM), Enhanced Data GSM Environment (EDGE), wideband code division multiple access (W-CDMA), Long Term Evolution (LTE), code division multiple access (CDMA), time division multiple access (TDMA), Bluetooth, Wireless Fidelity (Wi-Fi) (such as IEEE 802.11a, IEEE 802.11b, IEEE 802.11g or IEEE 802.11n), voice over Internet Protocol (VoIP), light fidelity (Li-Fi), Worldwide Interoperability for Microwave Access (Wi-MAX), a protocol for email, instant messaging, and a Short Message Service (SMS).

The I/O device 208 may comprise suitable logic, circuitry, interfaces, and/or code that may be configured to act as an I/O channel/interface between a user (not shown) and the system 102. The I/O device 208 may comprise various input and output devices, which may be configured to communicate with different operational components of the system 102. For example, the I/O device 208 may receive information about phase difference threshold or information about different output signals or ports between which the phase is to be aligned or information about periodic interval at which the phase alignment process has to be triggered. In an embodiment, the system 102 may receive the control information for a particular programmable component or register of at least one of the plurality of PLL circuits 106 from the user, via the I/O device 208. Further, the I/O device 208 may output information about the phase alignment, for example, how much percentage of phase alignment is between different output signals of different PLL circuits, information about the phase difference threshold, number of steps or search time taken to perform the phase alignment, information about operating temperature or frequency range.

Examples of the I/O device 208 may include, but are not limited to, a touch screen, a keyboard, a mouse, a joystick, a microphone, and a display screen. The display screen may be a touch screen which may enable a user to provide a user-input via the display screen. The touch screen may be at least one of a resistive touch screen, a capacitive touch screen, or a thermal touch screen. The display screen may be realized through several known technologies such as, but not limited to, at least one of a Liquid Crystal Display (LCD) display, a Light Emitting Diode (LED) display, a plasma display, or an Organic LED (OLED) display technology, or other display devices. In accordance with an embodiment, the display screen may refer to a display screen of a head mounted device (HMD), a smart-glass device, a see-through display, a projection-based display, an electro-chromic display, or a transparent display.

The functions or operations executed by the system 102, as described in FIG. 1, may be performed by the processor

202. The operations executed by the processor 202 or the processor 104 are described in detail, for example, in FIGS. 3-5.

FIG. 3 is an exemplary block diagram that illustrate multiple PLL circuits for the phase alignment, in accordance with an embodiment of the disclosure. FIG. 3 is explained in conjunction with elements from FIG. 1 and FIG. 2. With reference to FIG. 3, there is shown a block diagram 300. As shown, the block diagram 300 may include a plurality of PLL circuits 106 (not shown) which may include, but not limited to, a first PLL circuit 106A and a second PLL circuit 106B. The first PLL circuit 106A and the second PLL circuit 106B may be connected in parallel as shown in FIG. 3. The two number of PLL circuits shown in FIG. 3 is presented merely as an example. The plurality of PLL circuits 106 may include more than two PLL circuits for the phase alignment between different PLL circuits, without deviation from the scope of the disclosure. For the sake of brevity, only two PLL circuits have been shown in FIG. 3. However, in some embodiments, there may be more than two PLL circuits, without limiting the scope of the disclosure.

Each of the first PLL circuit 106A and the second PLL circuit 106B may include different components, for example, but not limited to, a reference buffer 302, a phase detector and charge pump 304, a loop filter 306, a voltage controlled oscillator (VCO) 308, a low pass filter 310, a phase shifter 312, an amplifier 314, a multi-modulus divider (MMD) 316, and a delta sigma ($\Delta\Sigma$) modulator 318. As shown in FIG. 3, one of the plurality of PLL circuits 106 (for example the first PLL circuit 106A) may include the processor 202 or the processor 104. In some embodiments, the processor 104 may be part of the system 102 as shown, for example, in FIG. 1. In another embodiment, a processor (like processor 704) may be communicably coupled to each of the plurality of PLL circuits 106 as shown, for example, in FIG. 7. Each of the first PLL circuit 106A and the second PLL circuit 106B may further include a plurality of output signals 110 (or output ports) and a digital synchronizer 320. In an embodiment, each of the plurality of PLL circuits 106 may be on a single die, package, substrate, or module. Each of the first PLL circuit 106A and the second PLL circuit 106B may receive a reference frequency signal 108 (referred as "REF_IN"). In an embodiment, the reference frequency signal 108 may be a stable clock signal or a stable low-frequency reference signal which may not change its frequency due to any change in temperature, noise, or operating voltage and frequency. Each of the first PLL circuit 106A and the second PLL circuit 106B may be configured to stabilize the corresponding output signal (i.e. the plurality of output signals 110) in light of the stable reference frequency signal 108. In an embodiment, the first PLL circuit 106A and the second PLL circuit 106B may include programmable registers or components like the reference buffer 302, the phase detector and charge pump 304, the phase shifter 312, and the delta sigma modulator 318 as shown in FIG. 3. The processor 202 may be configured to control such programmable components or registers, using the control information, to align the phase between output signals of different PLL circuits. In an embodiment, the control information may correspond to time delay information that may be programmed or changed in the programmable components of the PLL circuits based on real-time measurement of the phase difference information between output signals of the first PLL circuit 106A and the second PLL circuit 106B.

The reference buffer 302 may comprise suitable logic, circuitry, or interfaces that may be configured to receive the stable reference frequency signal 108 (like a clock signal)

and provide an output to the phase detector and charge pump 304 of the respective PLL circuit. The reference buffer 302 may introduce a predefined time delay to the received reference frequency signal 108 to further change the phase of the reference frequency signal 108 and provide the reference frequency signal 108 (with the changed or controlled phase) to the phase detector and charge pump 304. In an embodiment, the processor 202 may control the reference buffer 302 using the control information to change the programmable time delay provided by the reference buffer 302 to the received reference frequency signal 108.

The phase detector and charge pump 304 may comprise suitable logic, circuitry, or interfaces that may be configured to perform functionalities of a phase detector and a charge pump. The phase detector may be configured to receive the reference frequency signal 108 from the reference buffer 302 and a feedback signal from the multi-modulus divider (MMD) 316. The feedback signal may be a VCO signal (high frequency signal output from the VCO 308) which may be divided by the MMD 316 using the delta sigma modulator 318. The phase detector and charge pump 304 may be configured to determine phase difference between the reference frequency signal 108 and the feedback signal, and further generate an error or voltage signal proportional to the determined phase difference.

In addition, the charge pump of the phase detector and charge pump 304 may comprise suitable logic, circuitry, or interfaces that may be configured to adjust an output of the charge pump based on the output voltage/error signal of the phase detector. The charge pump may increase the output to the VCO 308 when the voltage/error signal of the phase detector indicates that the feedback signal lags the reference frequency signal 108. Similarly, the charge pump may decrease the output to the VCO 308 when the voltage/error signal of the phase detector indicates that the feedback signal leads the reference frequency signal 108.

The loop filter 306 may comprise suitable logic, circuitry, or interfaces that may be configured to provide an output that may be electrically connected to an input of the voltage controlled oscillator (VCO) 308. The loop filter 306 with low-bandpass characteristics, may provide low pass filtering or conditioning to the signal output from the phase detector and charge pump 304, to further provide a control voltage to the voltage controlled oscillator (VCO) 308. In some embodiments, the loop filter 306 may provide the control voltage by elimination of unnecessary frequencies from the signal output from the phase detector and charge pump 304. The control voltage provided by the loop filter 306 may further control a frequency output from the VCO 308.

The voltage controlled oscillator (VCO) 308 may comprise suitable logic, circuitry, or interfaces that may generate a high-frequency signal based on the control voltage received from the loop filter 306. The frequency of the signal generated by the VCO 308 may be determined or controlled based on the control voltage received from the loop filter 306. For example, in case of increase in the control voltage from the loop filter 306, the frequency of the output signal from the VCO 308 may increase. Similarly, in case of decrease in the control voltage from the loop filter 306, the frequency of the output signal from the VCO 308 may decrease. Therefore, the generated output signal (i.e. high frequency signal) from the VCO 308 may be stable synchronized signal in light of the reference frequency signal 108. In other words, the phase of the output signal from the VCO may match the phase of the reference frequency signal 108. The signal generated by the VCO 308 may be further provided to the multi-modulus divider (MMD) 316 as the feedback signal to be further divided and provided to the phase detector and charge pump 304.

The low pass filter 310 may comprise suitable logic, circuitry, or interfaces that may be configured to receive the output signal (i.e. phase locked with the reference frequency signal 108) from the VCO 308. The low pass filter 310 may further remove unnecessary high frequency components from the received output signal and provide a smooth output signal to the phase shifter 312.

The phase shifter 312 may comprise suitable logic, circuitry, or interfaces that may be configured to adjust the phase (for example by a predefined increments) of a signal received from the VCO 308, via the low pass filter 310. The phase shifter 312 may be controlled by the processor 202 to adjust the phase. In an embodiment, the phase shifter 312 may correspond to a buffer which may be programmed or controlled by delay information to introduce a delay in the received signal and provide a phase adjustment in the signal received from the VCO 308, via the low pass filter 310.

The amplifier 314 may comprise suitable logic, circuitry, or interfaces that may be configured to amplify a signal received from the phase shifter 312 and provide the amplified signals as the plurality of output signals 110 as shown in FIG. 3. In an embodiment, the plurality of output signals 110 may be provided to output ports/terminals of the corresponding PLL circuit.

The combination of multi-modulus divider (MMD) 316 and the delta sigma modulator 318 may constitute a feedback path of each of the plurality of PLL circuits 106. The feedback signal received by the phase detector and charge pump 304 may be provided from the multi-modulus divider (MMD) 316. The MMD 316 may comprise suitable logic, circuitry, or interfaces that may receive a high frequency signal from the VCO 308 and further provide a lower frequency signal to the phase detector and charge pump 304 as the feedback signal. The MMD 316 may be configured to divide the received high frequency signal by a predefined scaling factor ("K", an integer) such that the divided signal may be of the lower frequency or closer to the frequency of the reference frequency signal 108.

The delta sigma modulator 318 may comprise suitable logic, circuitry, or interfaces that may be configured to generate a signal provided to the MMD 316. The generated signal from the delta sigma modulator 318 may control the scaling factor of the MMD 316. The delta sigma modulator 318 may be controlled by the processor 202 to control the scaling factor for the MMD 316. Further, the output signal from the MMD 316 may be provided to the delta sigma modulator 318. Such output signal may serve as a clock input to the delta sigma modulator 318. In some embodiments, the delta sigma modulator 318 is a digital block that may modulate a divide ratio (i.e. scaling factor) to perform the fractional division by the MMD 316.

The digital synchronizer 320 may comprise suitable logic, circuitry, or interfaces that may be controlled by the processor 202. The digital synchronizer 320 of one of the plurality of PLL circuits 106 may synchronize with the digital synchronizer 320 of other of the plurality of PLL circuits 106. For example, the digital synchronizer 320 of the first PLL circuit 106A may communicate with the digital synchronizer 320 of the second PLL circuit 106B. The digital synchronizer 320 of the first PLL circuit 106A may share a clock with the second PLL circuit 106B to perform time synchronization between both the PLL circuits. In another example, the control information programmed in different components of the first PLL circuit 106A may be further communicated to the respective components of the second PLL circuit 106B to perform the synchronization between both PLL circuits. Further details of the synchronization may be further provided, for example, in FIG. 4.

As shown in FIG. 3, different outputs signals of the corresponding PLL circuits may be combined by a summation block 322. The summation block 322 may comprise suitable logic, circuitry, or interface that may be configured to combine (or mathematically calculate the sum of) the received input signals. As shown in FIG. 3, the summation block 322 may receive a first output signal 110A (i.e. "LO_A_1") of the first PLL circuit 106A and a first output signal 110A (i.e. "LO_B_1") of the second PLL circuit 106B. With respect to the summation block 322, the first output signal 110A (i.e. "LO_B_1") of the second PLL circuit 106B may be referred as a second output signal. The combination of the first output signal of both the first PLL circuit 106A and the second PLL circuit 106B is merely shown as an example. In an embodiment, any particular output signal of different PLL circuits may be combined, without deviation from the scope of the disclosure. In an embodiment, the combined sum of the first output signal (i.e. "LO_A_1") of the first PLL circuit 106A and the second output signal (i.e. "LO_B_1") of the second PLL circuit 106B may be further provided to the processor 202. The combined sum or the signal may be referred as "LO_AB_1" as shown in FIG. 3. The processor 202 may be further configured to accurately perform the phase alignment between the corresponding output signals (i.e. "LO_A_1" and "LO_B_1") of different PLL circuits (i.e. first PLL circuit 106A and the second PLL circuit 106B). The phase alignment process performed by the processor 202 is further described, for example, in FIG. 4. In an embodiment, the system 102 may include a switch (not shown) or multiple summations blocks (now shown) which may receive different combinations of output signals from different PLL circuits. The processor 202 may be configured to receive user inputs (via I/O device 208) from the user of the system 102, where the user inputs may indicate which output signals of the plurality of PLL circuits 106 may be combined. Based on the user inputs, the processor 202 may accordingly control the switch or turn-on/activate the particular summation block to calculate the combined signal of the selected output signals and further perform the phase alignment between the selected output signals. In an embodiment, the processor 202 may directly receive the selected output signals to calculate the combined signal, rather than being received from the summation block 322. In other words, the first output signal 110A and the second output signal 110B may be directly provided to the processor 202 for the phase alignment, without being combined by the summation block 322.

FIG. 4 is a diagram that illustrates exemplary operations performed by the system of FIG. 1 for phase alignment between multiple phase-locked loop (PLL) circuits, in accordance with an embodiment of the disclosure. FIG. 4 is explained in conjunction with elements from FIG. 1, FIG. 2, and FIG. 3. With reference to FIG. 4, there is shown a block diagram 400. The exemplary operations of the block diagram 400 may be from 402 to 410 and may be performed by any computing system, for example, by the system 102 of FIG. 1, by the processor 104 of FIG. 1, by the processor 202 of FIG. 2 or by the electronic device 702 of FIG. 7.

At 402, phase difference may be determined. In an embodiment, the processor 202 may be configured to determine the phase difference information between the first output signal 110A (i.e. "LO_A_1" shown in FIG. 3) of the first PLL circuit 106A and the first output signal 110A (i.e.

"LO_B_1") shown in FIG. 3, hereinafter referred as the second output signal) of the second PLL circuit 106B. In other words, the processor 202 may be configured to determine the phase difference information between the first output signal of one of the plurality of PLL circuits 106 (for example the first PLL circuit 106A) and the second output signal of the other of the plurality of PLL circuits 106 (for example the second PLL circuit 106B). The phase difference information may indicate the phase difference with the first output signal and the second output signal or how much the first output signal and the second output signal are out of phase from each other.

In an embodiment, the processor 202 may be configured to determine power information (i.e. average power) of the combined signal (i.e. "LO_AB_1" shown in FIG. 3). The average power of the combined signal may also indicate the phase difference between the first output signal (i.e. "LO_A_1") and the second output signal (i.e. "LO_B_1"). For example, in case the first output signal and the second output signal are 180 degree out of phase then the average power of the combined signal may be zero or minimum. Similarly, if the first output signal and the second output signal are in-phase (with zero phase difference between each other), then the average power of the combined signal may be at maximum peak. Therefore, the processor 202 may be configured to determine the power information based on the summation of the first output signal and the second output signal, and further determine the phase difference information based on the determined power information. Based on the phase difference information, the disclosed system 102 may determine how much the output signals of different PLL circuits are out of phase from each other. In an embodiment, the processor 202 may capture multiple readings of the combined power or the phase difference to determine an average amount of the multiple readings. The average amount may be considered as the final phase difference information to further determine the control information. A single value of the combined power or the phase difference may correspond to a noise value due to fluctuations (like with input voltage). Therefore, the determination of the average amount may reduce the influence of the noise before finalization of the phase difference information in an accurate manner. In an embodiment, a number of samples to be taken for the multiple readings is configurable, either manually taken from the user or configured based on an application area of the system 102 or based on operating temperature or frequency range of the system 102. In an embodiment, the disclosed system 102 may rely on different methods to determine the phase difference between the output signals of multiple PLL circuits, like, but not limited to, analog phase detection (mixer) method, a digital phase detection method, a phase frequency detector, a time-to-digital convertor, or a power detection which a implemented within a PLL chip or implemented as a remote detector.

At 404, control information may be determined. In an embodiment, the processor 202 may be configured to determine the control information based on the phase difference information determined, for example, at step 402. The control information may indicate information based on which different programmable components or registers of the plurality of PLL circuits 106 are controlled. For example, the control information may indicate or correspond to time delay information which may be introduced or adjusted in a particular programmable component or register of one of the plurality of PLL circuits 106. Accordingly, an RF signal which may communicate via such component/register may change or fine-tune its phase angle. The processor 202 may provide such control information in either of the programmable register or component, for example, the reference buffer 302, the phase detector and charge pump 304, the phase shifter 312, and the delta sigma modulator 318. The control of such components based on the control information is further described, for example, at step 406 in FIG. 4.

In an embodiment, the memory 204 of the system 102 may store a table or a plurality of tables which may indicate a relationship between the phase difference information and the control information for each of the programmable register to be further controlled by the processor 202 based on the control information. Such tables may be referred as the lookup tables 308A as shown in FIG. 4. In some embodiments, the server 112 may store the lookup tables 308A, and the processor 202 may communicate with the server 112, via the communication network 114, to retrieve information stored in the lookup tables 308A. The system 102 or the server 112 may store a lookup table which may indicate the relationship between the phase difference information and the control information for each of the programmable components or registers of the plurality of PLL circuits 106. Examples of the relationship between the phase difference information and the control information for the reference buffer 302 are presented in Table 1, as follows:

| Phase Setting Index | Phase Difference (for Flo = 10 GHz, phase range ($\phi$r) = 360 degree range, and N as 100 steps | Time Delay (Control Information) |
|---|---|---|
| 0 | 0 | 0 |
| 1 | $\phi$r/N (3.6 degree) | 1 ps |
| 2 | 2 * $\phi$r/N (7.2 degree) | 2 ps |
| 3 | 3 * $\phi$r/N (10.8 degree) | 3 ps |
| . . . | . . . | . . . |
| N | $\phi$r (360 degree) | N ps |

Different phase setting indexes may indicate different relationships between the phase difference values and the time delay (i.e. control information) for the reference buffer 302 (i.e. programmable buffer). The phase difference values may indicate the phase difference information determined between the first output signal and the second output signal. "$\phi$r" may indicate the total phase range in which different phase setting indexes or phase differences may be divided. For example, "$\phi$r" may be 360 degree or 270 degree or 180 degree or 90 degree (or any other degree value) considering what maximum phase difference may occur between different output signals of different PLL circuits. The phase range may be chosen to cover a particular degree (like 360 degrees) of phase relative to the frequency (Flo) of an output signal (for example "LO_A_1") of the PLL circuit (like the first PLL circuit 106A). In other words, the total phase range covered may be relative to the reference frequency signal 108 (REF_IN) as the frequency (Fref) of "REF_IN" signal may correspond to Flo/Mdiv, where the Mdiv may indicate the divide ratio (or scaling factor of MMD 316).

The value of "N" may indicate a phase resolution of the phase differences or of the phase adjustment. For example "N"=100 may indicate that the phase settings may be indexed (or phase difference may be determined) in 100 different steps. Higher value of "N" may indicate higher (or finer) resolution of the phase differences and finer (or précised) phase control by the system 102 using the control information (i.e. time delay). The phase resolution may indicate the phase alignment accuracy between multiple PLL circuits. For example, in case the frequency of the output signal (Flo) is 10 GHz, therefore to provide the phase adjustment to cover the 360 degree ("$\phi$r") of the phase difference relative to Flo, the total phase delay (in time) should be 100 picosecond ($\phi$s), i.e. reciprocal of Flo=10 GHz. To provide the phase resolution of 1 ps, the phase differences and the phase delay may be divided in 100 steps (as "N"). Therefore, as shown in Table 1 for the reference buffer 302, the phase delay (in time) provided for the phase setting index of "1" (i.e. 3.6 degree of phase difference as "$\phi$r/N") is "1" ps. Similarly, the phase delay (in time) provided for the phase setting index of "2" (i.e. 7.2 degree of phase difference as "2*$\phi$r/N") is "2" ps. Similarly, the phase delay (in time) provided for the phase setting index of "N" (i.e. 360 degree of phase difference as "$\phi$r") is "N" ps. The phase delay (in time) or time delay information may correspond to the control information for the reference buffer 302. Therefore, Table 1 indicates the relationship between different phase setting indexes (or phase differences between output signals) and the time delays (as the control information) for the reference buffer 302.

In an embodiment, the lookup table (i.e. one of the lookup tables 308A) indicated by Table 1 may also be referred for the programmable phase detector and charge pump 304 and the phase shifter 312 (i.e. programmable phase shifter). In another embodiment, the look-up tables for the phase detector and charge pump 304 and the phase shifter 312 may be different from the lookup table for the reference buffer 302.

Similarly, the system 102 or the server 112 may store a lookup table to indicate the phase differences for the delta sigma modulator 318. Examples of the phase difference information for the delta sigma modulator 318 are presented in Table 2, as follows:

| Phase Setting Index | Phase Difference | Phase difference (for 3 bit delta sigma modulator) |
|---|---|---|
| 0 | 0 | 0 |
| 1 | $1/(2^N - 1) * \phi r$ | 45 degree |
| 2 | $2/(2^N - 1) * \phi r$ | 90 degree |
| 3 | $3/(2^N - 1) * \phi r$ | 135 degree |
| . . . | . . . | . . . |
| $2^N - 1$ | 360 | 360 degree |

In an embodiment, for an N-bit fraction in the delta sigma modulator 318, the phase differences may be defined where $2^N-1$ steps may cover the "$\phi$r" degree of the phase range relative to Flo (i.e. input frequency of the multi-modulus divider (MMD) 316). The time delay (i.e. or control information) corresponding to different phase difference values may be implemented in the delta sigma modulator 318 based on summation of a desired digital value in the delta sigma modulator 318. The control information (i.e. time delay) for the delta sigma modulator 318 may be determined based on frequencies of the reference frequency signal 108 (REF_IN) and frequency of the output signal (Flo). Therefore, the control information is not explicitly shown in Table 2 for the delta sigma modulator 318.

In an embodiment, based on the determination of the phase difference information between the first output signal and the second output signal (as described, for example, at step 402 in FIG. 4), the processor 202 may retrieve and analyze the lookup tables 308A to determine the control information for each or one of the programmable registers (i.e. reference buffer 302, the phase detector and charge pump 304, the phase shifter 312, or the delta sigma modulator 318). The control information may correspond to the time delay information or phase delay (in time) to be provided to a desired or selected programmable register of the selected PLL circuit to further control the phase alignment between the multiple PLL circuits. The control of the phase alignment between the multiple PLL circuits is further described, for example, at steps 406 and 408 in FIG. 4.

In an embodiment, to determine the control information, the processor 202 may be configured to search the lookup tables 308A or a particular lookup table (i.e. stored in the memory 204) based on the determined phase difference information. For example, to determine the control information for the reference buffer 302, the processor 202 may perform search in each row or particular rows of Table 1 to determine the time delay information for a particular phase difference value or phase setting index. For example, in case the phase difference between the first output signal and the second output signal is "3.6" degree (i.e. $\phi r/N$) for "360" degree phase range and "100" resolution steps, the processor 202 may search Table 1 and determine the control information (i.e. time delay information) as "1 ps" for the reference buffer 302. In an embodiment, the memory 204 may store a plurality of lookup tables for different phase ranges and phase resolutions. Based on the frequency ("Fref") of the reference frequency signal 108 ("REF_IN"), the output signal (like "LO_A_1"), and the phase resolution (like N=100 steps), the processor 202 may select a particular lookup table and conduct the search in the selected lookup table to reduce the search time for the control information based on the determined phase difference information. In an embodiment, the phase resolution ("N") may be static or may be dynamically selected in real-time by the user of the system 102 (via I/O device 208) based on specific application area or operating conditions (with specific temperature, frequency, or input voltage ranges) of the system 102. In some embodiments, the processor 202 may retrieve different lookup tables (or specific lookup table) from the server 112 based on the selected phase resolution or selected phase range or current operating temperature, frequency or input voltages.

At 406, one or more registers of a particular PLL circuit may be controlled. In an embodiment, the processor 202 may be configured to control at least one of the programmable register or component (i.e. reference buffer 302, the phase detector and charge pump 304, the phase shifter 312, or the delta sigma modulator 318) of one of the plurality of PLL circuits based on the control information determined at step 404. The control information may correspond to a value (like time delay) entered in the corresponding register, related to the at least one of the reference buffer 302, the phase detector and charge pump 304, the phase shifter 312, or the delta sigma ($\Delta\Sigma$) modulator 318, to further control the phase alignment. For example, the processor 202 may control the reference buffer 302 of the first PLL circuit 106A based on the time delay information (i.e. control information) determined based on the real-time phase difference between the first output signal and the second output signal. For the control of the reference buffer 302, the processor 202 may introduce or adjust the time delay (i.e. determined from the lookup tables 308A) in the reference buffer 302. The reference buffer 302 may consist of a series of inverter-buffers (not shown) which may provide digital to time conversion. The time delay may be introduced or changed in the reference buffer 302 as a delay chain including the series of inverter-buffers. For example, based on tapping off or removal of one or more inverter-buffers in the delay chain, and/or based on variation in supply voltage of the delay chain, a particular time delay may be achieved by the reference buffer 302. The processor 202 may control the reference buffer 302 based on the control information (or time delay information) determined or searched from the lookup tables 308A as described, for example, at step 404. For example, in case of the phase difference of "3.6" degree between the first output signal and the second output signal, the processor 202 may determine the phase delay (in time) of 1 ps and accordingly adjust/control the time delay to be provided by the reference buffer 302. Thus, the reference buffer 302 may provide a time delay of 1 ps to a signal (being processed by the reference buffer 302). As per FIG. 3, in such example, the reference buffer 302 may provide a time delay of 1 ps to the reference frequency signal 108. The time delay may further correspond to change in the phase angle for the reference frequency signal 108 being processed or passed by the reference buffer 302.

Similarly, based on the determined control information (i.e. time delay), the processor 202 may control either of the reference buffer 302, the phase detector and charge pump 304, the phase detector and charge pump 304, or the delta sigma modulator 318. In case of the phase detector and charge pump 304, the processor 202 may implement the time delay as a programmable static charge pump current at the output of the phase detector and charge pump 304. This may further offset the PD/CP (phase detector/charge pump) characteristics away from the zero-phase state. In case of the phase shifter 312, the processor 202 may adjust or implement the determined time delay (or the control information) as a typical quadrature interpolating phase shifting. In an embodiment, based on the provided time delay (or phase delay, in time), the phase shifter 312 may adjust the phase angle of the signal processed by the phase shifter 312. As per FIG. 3, the phase shifter 312 may adjust the phase of the output signal received from the low pass filter 310 based on the control information determined from the lookup tables 308A by the disclosed system 102. In case of the delta sigma modulator 318, the time delay (i.e. or control information) corresponding to different phase difference values may be implemented in the delta sigma modulator 318 based on summation of a desired digital value into the delta sigma modulator 318. The processor 202 may be configured to program or provide the determined time delay information to the delta sigma modulator 318 which may further adjust the divide ratio (i.e. scaling factor) of the MMD 316.

In an embodiment, the processor 202 may control one of the programmable registers (i.e. reference buffer 302, the phase detector and charge pump 304, the phase shifter 312, or the delta sigma modulator 318) based on the determined control information and the phase difference information between the first output signal and the second output signal. In some embodiments, the processor 202 may control multiple registers based on the determined control information related to the multiple registers. The processor 202 may control one or more of the programmable registers or components of one of the plurality of PLL circuits 106. For example, in FIG. 3, the processor 202 may control one of the programmable registers of the first PLL circuit 106A. In another example, the processor 202 may control one of the programmable registers of the second PLL circuit 106B. In another example, the processor 202 may control one of the programmable registers of both the first PLL circuit 106A and the second PLL circuit 106B.

At 408, the phase alignment may be controlled. In an embodiment, the processor 202 may be configured to control the phase alignment between the first output signal and the second output signal based on the control of one or more of the programmable registers (described, for example, at step 406). The phase alignment may reduce the phase difference between the first output signal and the second output signal based on the control of the programmable registers. For example, based on the adjusted or controlled time delay in the reference buffer 302, the phase delay (in time) provided to the reference frequency signal 108 by the reference buffer 302 may further reduce the phase difference between the first output signal and the second output signal. Similarly, based on the control of either of the programmable phase detector and charge pump 304, the phase shifter 312, or the delta sigma modulator 318 using the corresponding control information, the phase difference between the first output signal and the second output signal may be reduced, which in return may provide or improve the phase alignment between both the output signals of multiple PLL circuits (such as the first PLL circuit 106A and the second PLL circuit 106B as per FIG. 3). In an embodiment, the phase alignment between the multiple PLL circuits may be performed during a calibration phase of the system 102 or the calibration phase of the plurality of PLL circuits 106.

In an embodiment, the processor 202 may achieve the complete or accurate phase alignment between the combined signals in a single step where the processor 202 may determine the phase difference information, determine the control information, and control the programmable register only once to achieve the completed phase alignment. In some embodiments, the processor 202 may iteratively perform steps 402-408 of FIG. 4 multiple times to achieve the complete phase alignment between the output signals of the multiple PLL circuits. In such case, based on the control of one of the programmable registers, the processor 202 may again determine the phase difference (step 402), determine the control information (step 404) and accordingly control one of the programmable registers (step 406) multiple times/steps until the accurate phase alignment is achieved between the first output signal of the first PLL circuit 106A and the second output signal of the second PLL circuit 106B. In such case, the processor 202 may search the control information in multiple steps based on the determined phase difference. For example, in case of initial phase difference of 90 degree, the processor 202 may search the time delay of 25 ps with the phase setting index of "25" (as per Table 1), and accordingly control the reference buffer 302 to introduce the phase delay (in time) for 25 ps. For example, in the next cycle if the phase difference is determined as 18 degree, the processor 202 may search the time delay of 5 ps with the phase setting index of 5 (as per Table 1) and accordingly control the reference buffer 302. For example, in the next cycle if the phase difference is determined as 1 degree, the processor 202 may search the time delay of 1 ps with the phase setting index of 1 (as per Table 1) and accordingly control the reference buffer 302. In case, after the interactive process of 3 steps, the phase difference information indicates zero phase difference between the first output signal and the second output signal, the phase alignment may be achieved between the first output signal and the second output signal. Such interactive process (in multiple search steps) may be referred as the control of the phase alignment between the output signals of the multiple PLL circuits. In an embodiment, the combined signal (i.e. "LO_AB_1") may observe phase noise improvement based on the phase alignment between the first output signal (i.e. "LO_A 1") and the second output signal ("LO_B_1").

In an embodiment, the processor 202 may perform a linear search or a binary search to control the phase alignment between output signals of multiple PLL circuits. In the linear search, the phase difference between the output signals may incremented or decremented by at least one degree based on the control information to further control the phase alignment. In another embodiment, the processor 202 may modify the phase between the output signals by at least one degree (like 9 degree to 8 degree and further to 7 degree and so on) and accordingly determine the phase difference and the control information to achieve the phase alignment. In the incremental control, at each search step the phase of the first output signal may be increased or decreased to move closer to the phase of the second output signal. Therefore, for the linear search, the number of search steps taken by the disclosed system 102 may be higher, but may provide finer phase alignment. Therefore, for the linear search, the processor 202 may be configured to incrementally control the phase alignment between the first output signal and the second output signal based on continuous determination of the phase difference information and the control information, until the first output signal is completely phase aligned with the second output signal. The incremental control of the phase may correspond to a specific number of search steps taken by the processor 202 to accurately align the phase (or achieve phase alignment) between the first output signal and the second output signal, where each step may include determination of the phase difference information (step 402), determination of the control information (step 404) and the control of a particular programmable register of one of the plurality of PLL circuits 106 (step 406). In the linear search, the number of search steps may be higher in comparison to the binary search.

In contrast, in the binary search, the processor 202 may adjust the phase in large steps (for example 270 degree to 180 degree or 90 degree to 45 degree). The processor 202 may determine the control information for the programmable registers based on the larger search steps. Therefore, the binary search for the phase alignment may be much faster and number of search steps are lesser than the linear search. In certain situations/applications, the disclosed system 102 may follow both the search approaches (linear and binary) to save time and precisely provide phase alignment (for example the changing the phase difference from 90 degree to 45 degree and further to 42 degree based on linear increments in the control information to align the phases between the output signals of multiple PLL circuits. In some embodiments, the number of search steps to be taken substantially may be configured to influence the search time for the phase alignment. In such case, the system 102 may receive information about the number of search steps from the user, via the I/O device 208 or directly from the server 112. Therefore, the disclosed system 102 may be flexible enough to allow the number of search steps or the search time to be configured based on the application areas or user requirements. Based on user inputs related to the number of search steps or the search time/speed for the phase alignment, the processor 202 may be configured to either select the linear search or the binary search, or the combination to control the phase alignment between multiple PLL circuits.

In an embodiment, the processor 202 may be configured to determine the phase difference information based the power information (i.e. combined power) of combined output signals (i.e. LO_AB_1) as described, for example, at 402 in FIG. 4. In such case, the processor 202 may control the phase alignment between the first output signal and the second output signal until maximum power is achieved in the determined power information. For example, based on the control of one of the programmable registers and the control of the phase alignment (as described at steps 406 and 408), the processor 202 may continuous determine or monitor the power information of the combined output signal and accordingly determine the phase difference, the control information, and control the programmable registers until the maximum combined power (i.e. peak) is achieved. The maximum combined power (i.e. peak) may indicate accurate phase alignment between the first output signal (i.e. "LO_A_1") and the second output signal (i.e. "LO_B_1") based on which the combined output signal (i.e. "LO_AB_1") may be formed (as shown in FIG. 3). In an embodiment, the processor 202 may be configured to search the control information in the lookup tables 308A for the programmable one or more registers, until the maximum combined power (i.e. peak). In some embodiments, the processor 202 may monitor the power of the combined output signals (i.e. "LO_AB_1"), the update or record the optimal control information for the maximum value of the combined power. The recorded control information may be further utilized to achieve the phase alignment between the corresponding output signals during the re-calibration or operational phase of the system 102.

In an embodiment, the processor 202 may be configured to update the relationship between the phase difference information and the control information as indicated in Tables 1-2. In such case, the processor 202 may fine-tune or adjust the values in the control information (i.e. determined for a particular programmable register) to achieve the final phase alignment between the output signals of the multiple PLL circuits, where the fine adjusted values of the control information may not be stored in the lookup tables 308A. For example, in case the control information indicate 2 ps of time delay for the reference buffer 302, and the processor 202 fine tune the control information (like from 2 ps to 2.1 ps) to control the reference buffer 302 and to achieve the phase alignment, the value of 2.1 ps (i.e. based on which the reference buffer 302 is controlled) may be updated in the lookup tables 308A which indicates the relationship between the phase difference information and the control information. The updated lookup tables 308A or the relationship may be utilized in future for the phase alignment by the disclosed system 102. For example, the updated table may be utilized during the re-calibration phase or at operational phase of the system 102 or once the phase alignment process is triggered again based on real-time conditions (like temperature change, operating voltage or frequency change). The trigger of the phase alignment based on different real-time conditions are described later in the disclosure. Further, the re-calibration using the updated lookup tables 308A (including the updated phase difference information and the updated control information for the aligned phases), may save certain time (like search time) because of the initialization of the phase alignment process using the updated values.

At 410, the synchronization may be performed. In an embodiment, the processor 202 may be configured to synchronize the plurality of PLL circuits 106 based on the phase alignment performed in one of the plurality of PLL circuits 106. For example, based on the control of the phase alignment in the first PLL circuit 106A, the processor 202 may control the digital synchronizer 320 to time synchronize the processing between the first PLL circuit 106A and the second PLL circuit 106B between which the phase alignment is performed. As shown in FIG. 3, each of the plurality of PLL circuits 106 may include the digital synchronizer 320 which may be configured to receive the reference frequency signal 108. The digital synchronizer 320 of the first PLL circuit 106A may time synchronize with the digital synchronizer 320 of the second PLL circuit 106B. For the time synchronization, the digital synchronizer 320 of the first PLL circuit 106A may synchronize or provide a clock signal to the digital synchronizer 320 of the second PLL circuit 106B (as shown in FIG. 3) in relation to the reference frequency signal 108. For the synchronization, the digital synchronizer 320 may control at least one of the programmable registers (i.e. reference buffer 302, the phase detector and charge pump 304, the phase shifter 312, or the delta sigma modulator 318) in each of the plurality of PLL circuits 106 based the determined control information. This means that the control information may be adjusted in the corresponding register (like reference buffer 302) in each of the plurality of PLL circuits 106 simultaneously to effectively control the phase alignment between the first output signal and the second output signal. Such synchronization between the first PLL circuit 106A and the second PLL circuit 106B may further reduce or optimize the search time to achieve the phase alignment between the first PLL circuit 106A and the second PLL circuit 106B, because the corresponding registers (for example the reference buffer 302) in multiple PLL circuits may be controlled or programmed substantially at the same time. In an embodiment, the first PLL circuit 106A may receive an asynchronous synchronization signal, synchronize the received asynchronous synchronization signal with respect to the clock signal, and further drive the second PLL circuit 106B (or other PLL circuits) with the synchronization signal. The synchronization provided within the system 102 (like to the second PLL circuit 106B by the digital synchronizer 320 of the first PLL circuit 106A) may eliminate any requirement of common external synchronization input signal for each of the plurality of PLL circuits 106.

In an embodiment, as shown in FIG. 4, the processor 202 may control the digital synchronizer 320 one or more times during the iterative process of phase alignment (i.e. execution of steps 402-408 of FIG. 4 multiple times to achieve the complete phase alignment between the output signals). For such iterative synchronization, based on the execution of each search step and control of programmable registers, the processor 202 may control the digital synchronizer 320 to time synchronize the processing between the first PLL circuit 106A and the second PLL circuit 106B. After each search and control step, the digital synchronizer 320 may control at least one of the programmable registers in each of the plurality of PLL circuits 106 based the determined control information or the control information may be programmed or adjusted in the corresponding register (like reference buffer 302) in each of the plurality of PLL circuits 106 simultaneously to effectively control the phase alignment between the first output signal and the second output signal.

In an embodiment, the system 102 may be triggered to perform the phase alignment between different (or predefined) combinations of output signals of multiple PLL circuits based on different conditions. In an embodiment, the memory 204 may be configured to store threshold information which may indicate a threshold value for a phase difference. When the phase difference (i.e. indicated by the phase difference information) is equal or above the stored threshold information, then the processor 202 may trigger or initiate the phase alignment process (for example steps 402-410 of FIG. 4) between the defined output signals of multiple PLL circuits. The threshold information may indicate allowable phase mismatch between the output signals of multiple PLL circuit before the triggering of the phase alignment. For example, the threshold information may indicate a phase difference of 10 degree for a particular combination of output signals related to different combination of PLL circuits and the real-time phase difference between the output signals is equal or more than 10 degrees or more, then the processor 202 may trigger and determine the control information and further control the phase alignment based on the control of the corresponding components/registers of one of the PLL circuits. In such example, the real-time phase difference between the output signals of less than 10 degree may be allowed (i.e. as indicated by the threshold information) and may not trigger the phase alignment process. Therefore, the processor 202 may be configured to retrieve the predefined threshold information from the memory 204 or from the server 112 and further compare the retrieved threshold information from monitored (in real-time) phase difference between the first output signal and the second output signal. Based on the comparison between the threshold information (indicating threshold phase difference) and the phase difference information, the processor 202 may control the phase alignment between the first output signal and the second output signal based on the control information and control of the corresponding registers (as described, for example, at steps 404-408). In an embodiment, the processor 202 may receive the threshold information from the user, via the I/O device 208. The user may define the threshold information based on an application area of the system 102 or based on operating temperature, voltage, or frequency ranges of the system 102. In some embodiments, based on the control of the phase alignment between the first output signal and the second output signal, the processor 202 may update the threshold information and store the updated threshold information in the memory for future initiation or re-calibration of the phase alignment. In certain situations, the updated threshold information may be received as a user input, via the I/O device 208.

In an embodiment, the processor 202 may be configured to periodically trigger the phase alignment process at a specific time interval. For example the specific time interval may be once in an hour, a day, a week, a month, or a year which may be stored in the memory 204 or in the server 112. In such case, the processor 202 may retrieve the stored time interval from the memory 204 or from the server 112 and initiate the control of the phase alignment between the first output signal and the second output signal periodically based on the retrieved time interval. In some embodiments, the specific time interval may be defined by the user, where the processor 202 may receive information about the time interval from the user, via I/O device 208. The user may define the time interval based on an application area of the system 102 or based on operating temperature, voltage, or frequency ranges of the system 102. In some embodiment, the processor 202 may be configured to trigger the phase alignment process based on a manual request, where the user may provide an on-demand request to the system (for example via the I/O device 208) to initiate the phase alignment process between the multiple output signals of combined PLL circuits. For example, the user may manually trigger the phase alignment at a time of utilizing a new semiconductor chip (including one PLL circuit or the plurality of PLL circuits 106) or using a RF wireless device for the first time. Thus, the user may trigger the phase alignment as a calibration step before an operational state of the new semiconductor chip or the RF wireless device.

In an embodiment, the processor 202 may trigger the control of the phase alignment based on real-time temperature change or temperature ranges in which the system 102 may be operating. The processor 202 may be configured to determine temperature change information which may indicate an amount of temperature (in degree Celsius or Fahrenheit) beyond or below which the automated phase alignment process may be triggered by the system 102. For example, threshold temperature information (either stored in the memory 204 or in the server 112) indicates that beyond 100 degree Fahrenheit ambient temperature or below 30 degree Fahrenheit ambient temperature, the phase alignment process should be initiated because the probability of phase drifts between the predefined output signals of multiple PLL circuits is higher in such temperature ranges. Therefore, the processor 202 may periodically monitor the ambient temperature (for example via a temperature sensor (not shown) integrated in the system 102 or coupled to the system 102) and compare the measured temperature from the stored threshold temperature information, and accordingly trigger the control of the phase alignment between the first output signal and the second output signal based on the comparison. For example if the ambient temperature is 120 degree Fahrenheit which is higher than the predefined threshold temperature information (for example 100 degree Fahrenheit), the processor 202 may determine the temperature change information as 20 degree (i.e. comparison of the ambient temperature and the threshold temperature information) and accordingly trigger the control of the phase alignment between the first output signal and the second output signal based on the determined temperature change information. In some embodiments, the threshold temperature information may be defined by the user, where the processor 202 may receive the threshold temperature information from the user, via I/O device 208. The user may define the threshold temperature information based on an application area of the system 102 or based on operating temperature, voltage, or frequency ranges of the system 102. In an embodiment, the threshold temperature information may define a particular temperature range, for example, 80 degree-120 degree Fahrenheit) and the system 102 may trigger the phase alignment process, when the ambient operating temperature of the system 102 is within the defined temperature range, as the chances of phase drifts between the output signals of particular PLL circuits is higher in such temperature ranges. In another embodiments, the processor 202 may trigger the phase alignment based on different input voltage ranges (or threshold) and/or based on different frequency ranges (or threshold) in which the system 102 may operate. The memory 204 may store threshold values for such input voltage ranges and/or frequency ranges which may be retrieved by the processor 202 during calibration or operating phases of the system 102. Thus, based on different triggering methods/situations (i.e. manual, threshold-based, operating temperature, operating frequency, periodic, and the like), and automated phase alignment process (as described, for example, in FIG. 4), the disclosed system 102 may dynamically control or achieve the phase alignment between multiple PLL circuits even though there are different mismatches between the PLL circuits (either systematic mismatch or random mismatch) and noise generated in PLL based devices due to different environmental conditions and fluctuations.

In an embodiment, the system 102 may configured to store the control information for different programmable registers/components of each of the plurality of PLL circuits 106 for different operating temperature ranges and/or for different operating frequency ranges. Therefore, the system 102 may store various lookup tables (similar to lookup tables 308A) for different operating temperature and frequency ranges, as the chances and magnitude of phase drifts between different output signals of multiple PLL circuits could be different for different application areas and situations. Therefore, the processor 202 may be configured to determine an operating temperature of the system 102 (for example via the integrated or coupled temperature sensor, not shown) and search the corresponding lookup table predefined for the determined operating temperature or range. The processor 202 may further search or determine, from the corresponding lookup table, the appropriate control information for corresponding programmable registers of different/one of PLL circuits based on real-time determination of the phase difference (step 402) between corresponding output signals. Thus, the processor 202 may determine the control information based on the determined phase difference information and the determined operating temperature. Further, based on the determined control information, the processor 202 may further control the phase alignment between the corresponding output signals as described, for example, at steps 406-408 in FIG. 4.

Similarly, the processor 202 may be configured to determine an operating channel frequency of the system 102 (or operating frequency of the system 102 or frequency of the reference frequency signal 108 or frequency of the output signal of the one of the PLL circuits) and search the corresponding lookup table predefined for the determined operating channel frequency or range. The processor 202 may further search, from the corresponding lookup table, the appropriate control information for corresponding programmable registers of different/one of PLL circuits based on real-time determination of the phase difference (step 402) between corresponding output signals. Thus, the processor 202 may determine the control information based on the determined phase difference information and the determined operating channel frequency. Further, based on the determined control information, the processor 202 may further control the phase alignment between the corresponding output signals as described, for example, at steps 406-408 in FIG. 4. Thus, based on the exhaustive storage/search of the control information for different programmable components/registers and control of the phase alignment for different situations (i.e. different operating temperatures and frequency ranges), the system 102 may be robust and intelligent enough to manage or control various situations of phase drifts which may occur with the plurality of PLL circuits 106 on real-time basis. Further, different configurable parameters (like phase difference thresholds, number of search steps/time, search type (linear or binary), number of samples to calculate the average of multiple readings, etc.) provide variety of flexibilities to the user to utilize the disclosed system 102 in a robust manner and provide fine and accurate phase alignment between multiple PLL circuits in various situations/conditions/applications.

Further, it may be done that the phase alignment process (as described, for example, in FIGS. 3 and 4 for the two output signals of multiple PLL circuits is presented merely as an example of phase alignment process. The present disclosure may be also applicable to any number of output signals or ports of different PLL circuits in a communication device or multiple PLL's in a single die, package, substrate, or module. A description of the phase alignment process for any number of output signals or ports of different PLL circuits has been omitted from the disclosure for the sake of brevity.

Figure 5A:
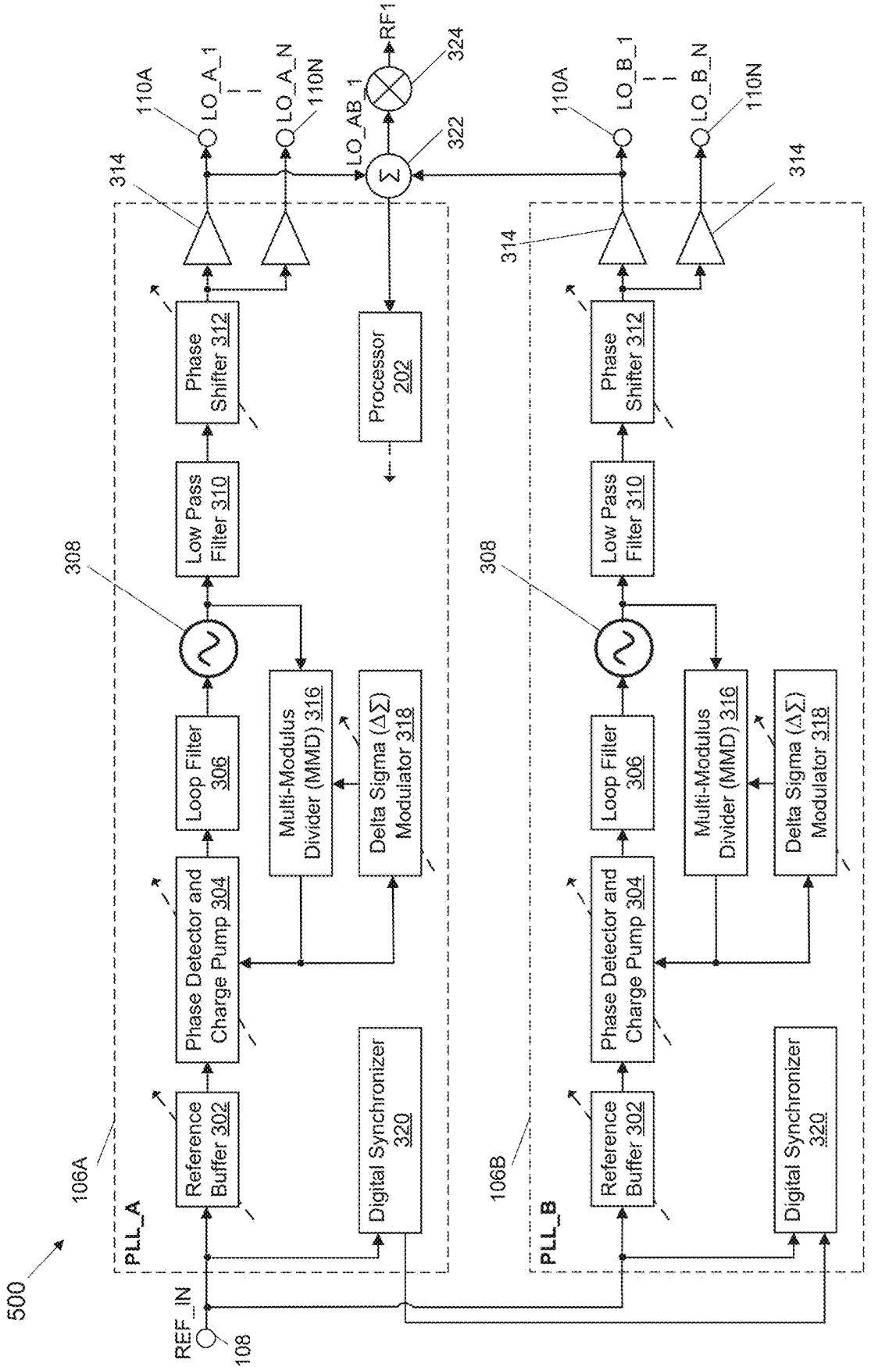
FIGS. 5A and 5B are diagrams that collectively illustrate multiple PLL circuits with mixers, in accordance with an embodiment of the disclosure.
Figure 5B:
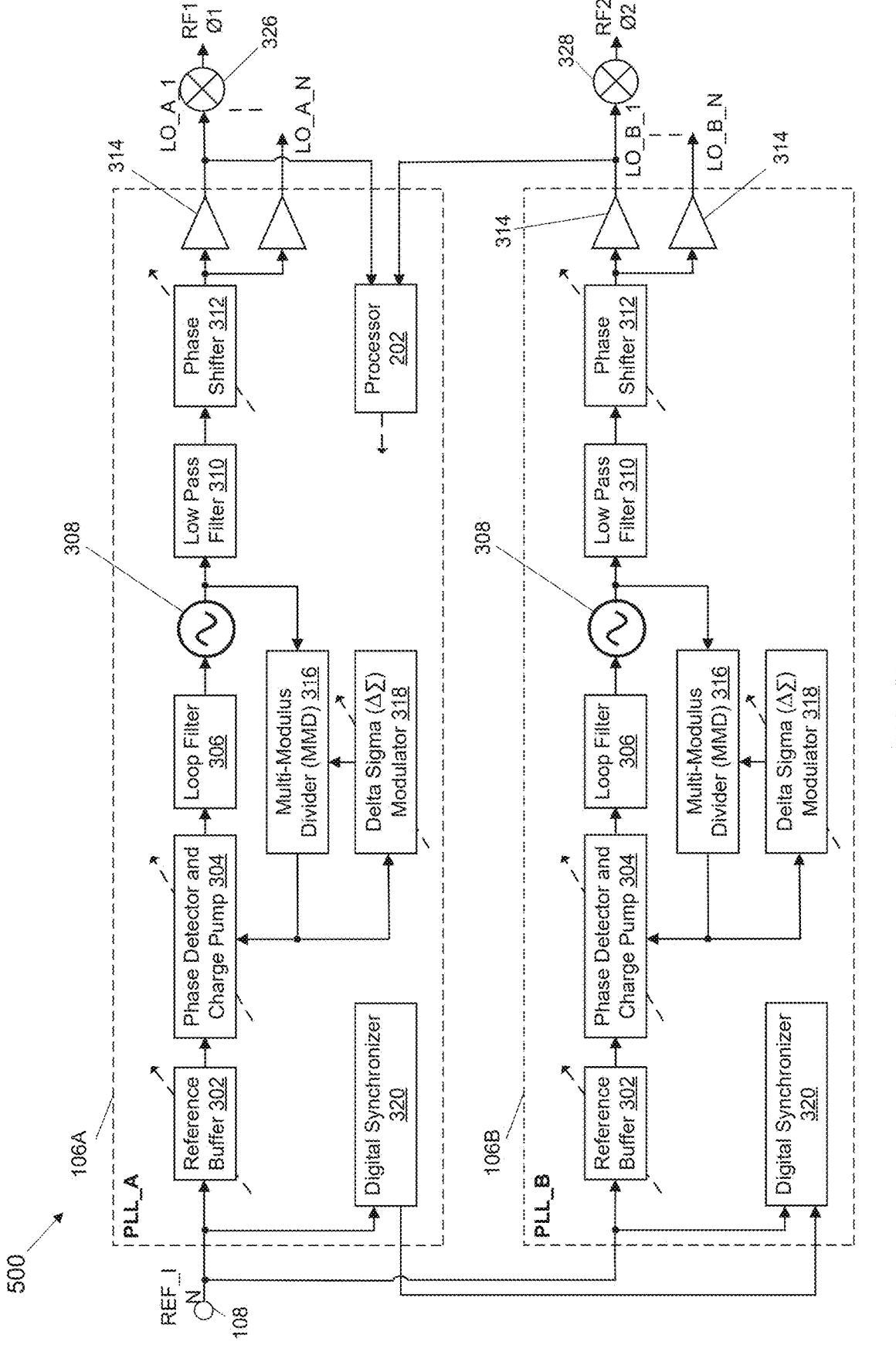

FIGS. 5A and 5B are diagrams that collectively illustrate multiple PLL circuits with mixers, in accordance with an embodiment of the disclosure. FIGS. 5A and 5B are explained in conjunction with elements from FIG. 1, FIG. 2, FIG. 3, and FIG. 4. With reference to FIGS. 5A and 5B, there is shown a block diagram 500 including the plurality of PLL circuits 106 which may include the first PLL circuit 106A and the second PLL circuit 106B connected in parallel with each other, similar to as shown in FIG. 3.

As described, for example, in FIGS. 3 and 4, the first output signal (i.e. "LO_A_1") and the second output signal (i.e. "LO_B_1") may be combined by the summation block 322 to form a combined signal as "LO_AB_1". In FIG. 5A, there is shown a mixer 324 that may be configured to receive the combined signal ("LO_AB_1"). to produce an output signal "RF_1". The mixer 324 may be a single mixer that may drive the combined signal ("LO_AB_1"), i.e. generated based on the combination of corresponding output signals of the first PLL circuit 106A and the second PLL circuit 106B for which the phase alignment may be performed (as described, for example, in FIGS. 3 and 4). With reference to FIG. 5B, there is shown the plurality of PLL circuits 106 which may include the first PLL circuit 106A and the second PLL circuit 106B connected in parallel with each other, similar to as shown in FIG. 3. In FIG. 5B, there is shown a first mixer 326 and a second mixer 328. The first mixer 326 may be configured to receive an output signal (like "LO_A 1") of the first PLL circuit 106A and provide an output signal as "RF1" (with phase "φ1"). The second mixer 328 may be configured to receive an output signal (like "LO_A B") of the second PLL circuit 106B and provide an output signal as "RF2" (with phase "φ2"). Similarly, separate mixer may be provided to each of the plurality of PLL circuits 106 as shown in FIG. 5B. As shown in FIG. 5B, the processor 202 may be configured to directly receive the output signals (i.e. "LO_A 1" and "LO_B_1") of multiple PLL circuits, without being received via the combiner or any summation block (like summation block 322 in FIG. 3). In an embodiment, output signals from the mixers (like "RF_1" and "RF_2") may be further combined at a combined output port (like a secondary port, not shown) of the system 102. In some embodiments, the combined output signal of both the first mixer 326 and the second mixer 328 may be provided to the processor 202 to further determine the phase difference information and control the phase alignment as described, for example, in FIG. 4. Each of the mixers shown in FIGS. 5A-5B (like the mixer 324, the first mixer 326, and the second mixer 328) may be configured to either modulate or demodulate an input signal or convert the change the frequency of the input signal based on the requirement or application areas. The difference in the mixer configurations between FIG. 5A and FIG. 5B is mainly application dependent. In FIG. 5A, a single LO signal may provide a common LO signal to a transceiver system (like the system 102). In FIG. 5B, multiple LO paths available may allow independent control of each LO phase driving the separate mixers in the transceiver system, which may further enable the programmability of the second output signals ("LO_B") to have a defined phase offset relative to the first output signals ("LO_A").

Figure 6:
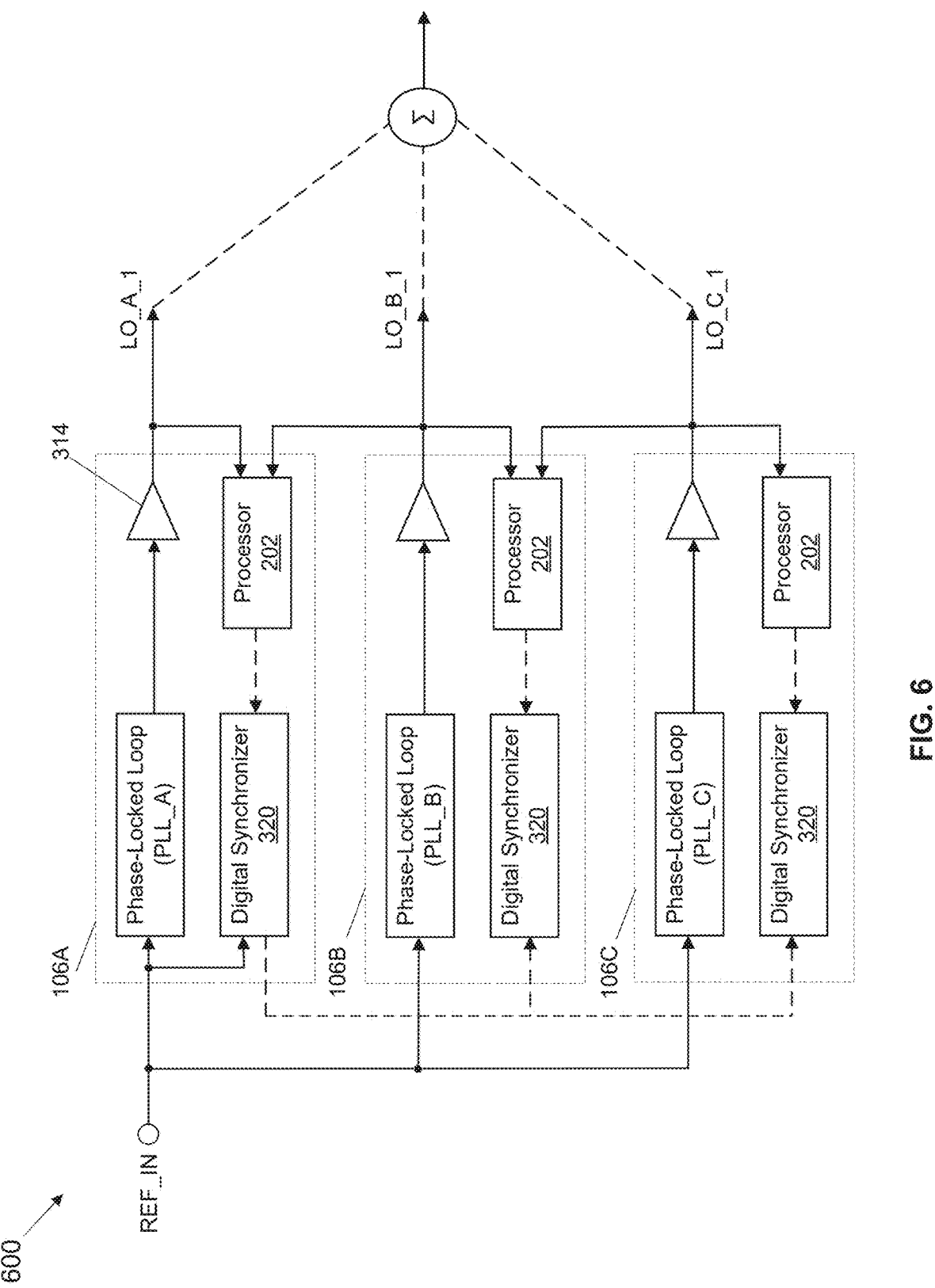
FIG. 6 is an exemplary block diagram that illustrate multiple PLL circuits serially connected, in accordance with an embodiment of the disclosure.

FIG. 6 is an exemplary block diagram that illustrate multiple PLL circuits serially connected, in accordance with an embodiment of the disclosure. FIG. 6 is explained in conjunction with elements from FIG. 1, FIG. 2, FIG. 3, FIG. 4, FIG. 5A, and FIG. 5B. With reference to FIG. 6, there is shown a block diagram 600. As shown, the block diagram 600 may include a plurality of PLL circuits (i.e. similar to the plurality of PLL circuits 106) which may include a first PLL circuit 106A, a second PLL circuit 106B, and a third PLL circuit 106C. The functions of the first PLL circuit 106A and the second PLL circuit 106B shown in FIG. 6 may be same as the functions of the first PLL circuit 106A and the second PLL circuit 106B described, for example, in FIGS. 3 and 4. Therefore, the description of the first PLL circuit 106A and the second PLL circuit 106B is omitted in FIG. 6 from the disclosure for the sake of brevity. Further, it may be noted that the 3 number of PLL circuits shown in FIG. 6 is presented merely as an example. The block diagram 600 may include only two or more than three PLL circuits, without deviation from the scope of the disclosure. For the sake of brevity, only 3 PLL circuits have been shown in FIG. 6. However, in some embodiments, there may be more than 3 PLL circuits, without limiting the scope of the disclosure.

In an embodiment, as shown in FIG. 6, each of the plurality of PLL circuits 106 may be serially connected with each other. As shown in FIG. 3, the plurality of PLL circuits 106 may be connected in parallel with each other. The serial connection between the first PLL circuit 106A ("PLL_A"), the second PLL circuit 106B ("PLL_B"), and the third PLL circuit 106C ("PLL_C") may form a daisy chained configuration. An output signal ("LO_C_1") of the third PLL circuit 106C ("PLL_C") may be fed to the second PLL circuit 106B ("PLL_B") and an output signal ("LO_B_1") of the second PLL circuit 106B ("PLL_B") may be fed to the first PLL circuit 106A ("PLL_A"), as shown in FIG. 6. The processor 202 of one of the plurality of PLL circuits 106 (like the first PLL circuit 106A) and digital synchronizer 320 may be configured to perform the phase alignment between the output signals (like "LO_A 1" and the "LO_B_1") related to the multiple PLL circuits (like the first PLL circuit 106A and the second PLL circuit 106B) as described, for example, in FIG. 4.

Figure 7:
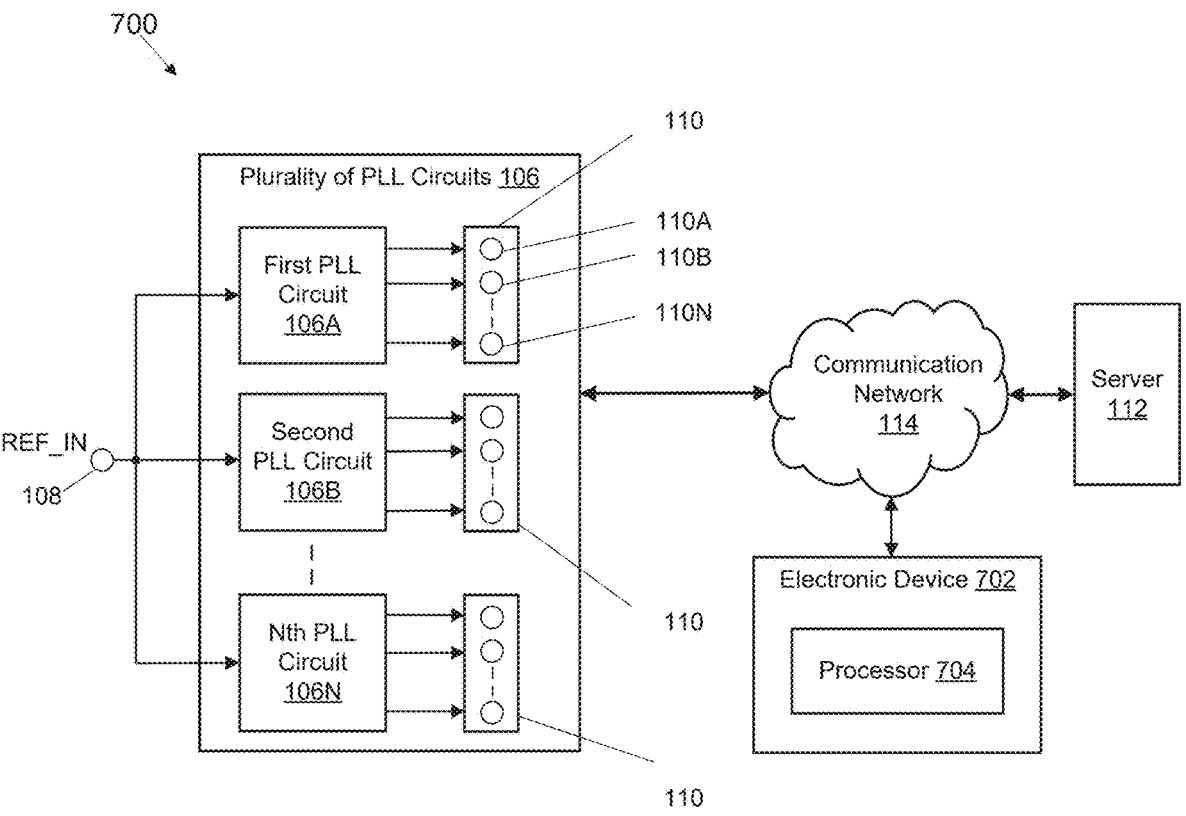
FIG. 7 is a block diagram that illustrates an electronic device coupled with multiple PLL circuits for phase alignment, in accordance with an embodiment of the disclosure.

FIG. 7 is a block diagram that illustrates an electronic device coupled with multiple PLL circuits for phase alignment, in accordance with an embodiment of the disclosure. FIG. 7 is explained in conjunction with elements from FIG. 1, FIG. 2, FIG. 3, FIG. 4, FIG. 5A, FIG. 5B, and FIG. 6. With reference to FIG. 7, there is shown a block diagram 700. As shown, the block diagram 700 may include the plurality of PLL circuits 106 which may receive the reference frequency signal 108. Each of the plurality of PLL circuits 106 may include the plurality of output signals 110. The functions of the plurality of PLL circuits 106 shown in FIG. 7 may be same as the functions of the plurality of PLL circuits 106 described, for example, in FIGS. 3 and 4. Therefore, the description of the first PLL circuit 106A and the second PLL circuit 106B is omitted in FIG. 7 from the disclosure for the sake of brevity.

As shown in FIG. 7, the plurality of PLL circuits 106 may not be part of the disclosed system 102. In contract, the plurality of PLL circuits 106 (or a device including the plurality of PLL circuits 106) may be communicably coupled to an electronic device 702, via the communication network 114. The electronic device 702 may control (like remotely control, via a wired or wireless connection) the plurality of PLL circuits 106, for example, control the phase alignment between different PLL circuits of the plurality of PLL circuits 106. Examples of the electronic device 702 may include, but are not limited to, a calibration device, a control device, a wireless device, a computing device, a controller system, a server, a mainframe machine, a computer workstation, a smartphone, a cellular phone, a mobile phone, and/or a consumer electronic (CE) device. The electronic device 702 may include a processor 704. The functions of the processor 704 may be same as the functions of the processor 104 or the processor 202 described, for example, in FIGS. 1-4. Therefore, the description of the processor 704 is omitted in FIG. 7 from the disclosure for the sake of brevity. The processor 704 may automatically provide the phase alignment between different output signals of multiple PLL circuits (included in the plurality of PLL circuits 106).

For example, the processor 704 may determine the phase difference information between the first output signal of the plurality of output signals of one of the plurality of PLL circuits (like the first PLL circuit 106A) and the second output signal of the plurality of output signals of other of the plurality of PLL circuits (like the second PLL circuit 106B). The determination of the phase difference information is described, for example, in FIG. 4 (at step 402). The processor 704 may be further configured to determine the control information based on the determined phase difference information between the first output signal and the second output signal as described, for example, in FIG. 4 (at step 404). The processor 704 may be further configured to control at least one of the reference buffer 302, the phase detector and charge pump 304, the phase shifter 312, or the delta sigma modulator 318 of the one of the plurality of PLL circuits (like the first PLL circuit 106A) based on the determined control information as described, for example, in FIG. 4 (at step 406). The processor 704 may be further configured to control the phase alignment between the first output signal and the second output signal based on the control of the at least one of the reference buffer 302, the phase detector and charge pump 304, the phase shifter 312, or the delta sigma modulator 318 as described, for example, in FIG. 4 (at step 408).

FIG. 8 is a flowchart that illustrates exemplary operations for phase alignment between multiple phase-locked loop (PLL) circuits, in accordance with an embodiment of the disclosure. FIG. 8 is explained in conjunction with elements from FIG. 1, FIG. 2, FIG. 3, FIG. 4, FIG. 5A, FIG. 5B, FIG. 6, and FIG. 7. With reference to FIG. 8, there is shown a flowchart 800. The operations from 802 to 810 may be implemented, for example, by the system 102 of FIG. 1, the processor 202 of the FIG. 2, or the electronic device 702 of FIG. 7. The operations of the flowchart 800 may start at 802 and proceed to 804.

At 804, phase difference information may be determined between a first output signal and a second output signal. In an embodiment, the processor 202 may be configured to determine the phase difference information between the first output signal and the second output signal. The first output signal may be one of the plurality of output signals of one of the plurality of PLL circuits (such as the first PLL circuit 106A). The second output signal may be one of the plurality of output signals of other of the plurality of PLL circuits (such as the second PLL circuit 106B). The determination of the phase difference information is further described, for example, in FIG. 4 (at step 402).

At 806, control information may be determined based on the determined the phase difference information between the first output signal and the second output signal. In an embodiment, the processor 202 may be configured to determine the control information based on the determined phase difference information based on the first output signal and the second output signal as described, for example, in FIG. 4 (at step 404).

At 808, control of at least one of the reference buffer, the phase detector and charge pump, the phase shifter, or the delta sigma (ΔΣ) modulator may be performed based on the determined control information. In an embodiment, the processor 202 may be configured to control at least one of the reference buffer, the phase detector and charge pump, the phase shifter, or the delta sigma (ΔΣ) modulator of one of the plurality of PLL circuits (like the first PLL circuit 106A) based on the control information. The control information may refer to time delay information as described, for example, in FIG. 4 (at step 406).

At 810, phase alignment between the first output signal and the second output signal may be controlled based on the control of the at least one of the reference buffer, the phase detector and charge pump, the phase shifter, or the delta sigma (ΔΣ) modulator. In an embodiment, the processor 202 may be configured to control the phase alignment between the first output signal and the second output signal based on the control of at least one of the reference buffer, the phase detector and charge pump, the phase shifter, or the delta sigma (ΔΣ) modulator. The control of the phase alignment may be performed incrementally (in specific number of steps) based on the control information as described, for example, in FIG. 4 (at step 408).

Although the flowchart 800 is illustrated as discrete operations, such as 802, 804, 806, 808, and 810, the disclosure is not so limited. Accordingly, in certain embodiments, such discrete operations may be further divided into additional operations, combined into fewer operations, or eliminated, depending on the particular implementation without detracting from the essence of the disclosed embodiments.

Various embodiments of the disclosure may provide a non-transitory computer-readable medium and/or storage medium having stored thereon, computer instructions executable by a machine and/or a computer to operate a system (for example the system 102) or an electronic device (for example electronic device 702). The instructions may cause the machine and/or computer to perform operations that may include determination of phase difference information between a first output signal of a plurality of output signals of one of a plurality of PLL circuits and a second output signal of the plurality of output signals of other of the plurality of PLL circuits. The operations may further include determination of control information based on the determined phase difference information between the first output signal and the second output signal. The operations may further include control of at least one of the reference buffer, the phase detector and charge pump, the phase shifter, or the delta sigma (ΔΣ) modulator of the one of the plurality of PLL circuits based on the determined control information. The operations may further include control of phase alignment between the first output signal of the one of the plurality of PLL circuits and the second output signal of the other of the plurality of PLL circuits based on the control of the at least one of the reference buffer, the phase detector and charge pump, the phase shifter, or the delta sigma (I) modulator.

Exemplary aspects of the disclosure may include a system (such as the system 102) that may include a processor (for example the processor 104) and a plurality of phase-locked loop (PLL) circuits (for example the plurality of PLL circuits 106). Each of the plurality of PLL circuits may include a reference buffer (for example the reference buffer 302), a phase detector and charge pump (for example the phase detector and charge pump 304), a phase shifter (for example the phase shifter 312), and a delta sigma (ΔΣ) modulator (for example delta sigma modulator 318). Each of the plurality of PLL circuits may be configured to receive a reference frequency signal (for example the reference frequency signal 108) and output a plurality of output signals (for example the plurality of output signals 110).

The processor may be configured to determine phase difference information between a first output signal of the plurality of output signals of one of the plurality of PLL circuits (for example the first PLL circuit 106A) and a second output signal of the plurality of output signals of other of the plurality of PLL circuits (for example the second PLL circuit 106B). The processor may be further configured to determine control information based on the determined phase difference information between the first output signal and the second output signal. The processor may be further configured to control at least one of the reference buffer, the phase detector and charge pump, the phase shifter, or the delta sigma (ΔΣ) modulator of the one of the plurality of PLL circuits based on the determined control information. The processor may be further configured to control phase alignment between the first output signal of the one of the plurality of PLL circuits and the second output signal of the other of the plurality of PLL circuits based on the control of the at least one of the reference buffer, the phase detector and charge pump, the phase shifter, or the delta sigma (ΔΣ) modulator. In an embodiment, the control information may correspond to time delay information The system may further include a memory (for example the memory 204) configured to store a table which indicates a relationship between the phase difference information and the control information. The processor may be further configured to search the memory to determine the control information based on the determined phase difference information. The processor may be further configured to update the relationship in the table with values of the controlled at least one of the reference buffer, the phase detector and charge pump, the phase shifter, or the delta sigma (ΔΣ) modulator based on the phase alignment between the first output signal and the second output signal.

In an embodiment, the processor may be further configured to determine power information based on a summation of the first output signal and the second output signal and determine the phase difference information between the first output signal and the second output signal based on the determined power information. The processor may be further configured to control the phase alignment between the first output signal and the second output signal until maximum power is achieved in the determined power information.

In an embodiment, the processor may be further configured to incrementally control the phase alignment between the first output signal and the second output signal based on continuous determination of the phase difference information and the control information, until the first output signal is phase aligned with the second output signal. The incremental control of the phase alignment may correspond to a specific number of steps taken for the determination of the phase difference information, determination of the control information, and the control of the at least one of the reference buffer, the phase detector and charge pump, the phase shifter, or the delta sigma (ΔΣ) modulator of the one of the plurality of PLL circuits, to achieve the phase alignment between the first output signal and the second output signal.

In an embodiment, each of the reference buffer, the phase detector and charge pump, the phase shifter, and the delta sigma (ΔΣ) modulator may correspond to a register. The control information may correspond to a value entered in the register, related to the at least one of the reference buffer, the phase detector and charge pump, the phase shifter, or the delta sigma (ΔΣ) modulator, to further control the phase alignment.

The system may further include a digital synchronizer which may be configured to receive the reference frequency signal and time synchronize the control of the at least one of the reference buffer, the phase detector and charge pump, the phase shifter, or the delta sigma ($\Delta\Sigma$) modulator in each of the plurality of PLL circuits based on the determined control information and the received reference frequency signal.

In an embodiment, the processor may be further configured to retrieve threshold information stored in a memory, compare the determined phase difference information with the retrieved threshold information, and control the phase alignment between the first output signal and the second output signal based on the comparison. The processor may be further configured to update the threshold information based on the control of the phase alignment between the first output signal and the second output signal and store the updated threshold information in the memory. The processor may be further configured to periodically trigger the control of the phase alignment between the first output signal and the second output signal at a specific time interval.

In an embodiment, the processor may be further configured to retrieve determine temperature change information and trigger the control of the phase alignment between the first output signal and the second output signal based on the determined temperature change information. In an embodiment, the processor may be further configured to determine an operating channel frequency of the system, determine the control information based on the determined phase difference information and the determined operating channel frequency, and control the phase alignment between the first output signal and the second output signal based on the determined control information.

In an embodiment, the processor may be further configured to determine an operating temperature of the system, determine the control information based on the determined phase difference information and the determined operating temperature, and control the phase alignment between the first output signal and the second output signal based on the determined control information. In an embodiment, the plurality of PLL circuits are connected in parallel. In another embodiment, the plurality of PLL circuits are serially connected.

The present disclosure may be realized in hardware, or a combination of hardware and software. The present disclosure may be realized in a centralized fashion, in at least one computer system, or in a distributed fashion, where different elements may be spread across several interconnected computer systems. A computer system or other apparatus adapted to carry out the methods described herein may be suited. A combination of hardware and software may be a general-purpose computer system with a computer program that, when loaded and executed, may control the computer system such that it carries out the methods described herein. The present disclosure may be realized in hardware that comprises a portion of an integrated circuit that also performs other functions.

The present disclosure may also be embedded in a computer program product, which comprises all the features that enable the implementation of the methods described herein, and which when loaded in a computer system is able to carry out these methods. Computer program, in the present context, means any expression, in any language, code or notation, of a set of instructions intended to cause a system with information processing capability to perform a particular function either directly, or after either or both of the following: a) conversion to another language, code or notation; b) reproduction in a different material form.

While the present disclosure is described with reference to certain embodiments, it will be understood by those skilled in the art that various changes may be made, and equivalents may be substituted without departure from the scope of the present disclosure. In addition, many modifications may be made to adapt a particular situation or material to the teachings of the present disclosure without departure from its scope. Therefore, it is intended that the present disclosure not be limited to the particular embodiment disclosed, but that the present disclosure will include all embodiments that fall within the scope of the appended claims.

What is claimed is:

1. A system, comprising:
a plurality of phase-locked loop (PLL) circuits,
wherein each of the plurality of PLL circuits includes a reference buffer, a phase detector and charge pump, a phase shifter, and a delta sigma ($\Delta\Sigma$) modulator, and
wherein each of the plurality of PLL circuits is configured to receive a reference frequency signal and output a plurality of output signals; and
at least one processor coupled to each of the plurality of PLL circuits, wherein the at least one processor is configured to:
determine phase difference information between a first output signal of the plurality of output signals of one of the plurality of PLL circuits and a second output signal of the plurality of output signals of other of the plurality of PLL circuits,
determine control information based on the determined phase difference information between the first output signal and the second output signal,
control at least one of the reference buffer, the phase detector and charge pump, the phase shifter, or the delta sigma ($\Delta\Sigma$) modulator of the one of the plurality of PLL circuits based on the determined control information, and
control phase alignment between the first output signal of the one of the plurality of PLL circuits and the second output signal of the other of the plurality of PLL circuits based on the control of the at least one of the reference buffer, the phase detector and charge pump, the phase shifter, or the delta sigma ($\Delta\Sigma$) modulator.

2. The system according to claim 1, wherein the control information corresponds to time delay information.

3. The system according to claim 1, further comprising a memory configured to store a table which indicates a relationship between the phase difference information and the control information,
wherein the at least one processor is further configured to search the memory to determine the control information based on the determined phase difference information.

4. The system according to claim 3, wherein the at least one processor is further configured to update the relationship in the table with values of the controlled at least one of the reference buffer, the phase detector and charge pump, the phase shifter, or the delta sigma ($\Delta\Sigma$) modulator based on the phase alignment between the first output signal and the second output signal.

5. The system according to claim 1, wherein the at least one processor is further configured to:
determine power information based on a summation of the first output signal and the second output signal, and
determine the phase difference information between the first output signal and the second output signal based on the determined power information.

6. The system according to claim 5, wherein the at least one processor is further configured to control the phase alignment between the first output signal and the second output signal until maximum power is achieved in the determined power information.

7. The system according to claim 1, wherein the at least one processor is further configured to incrementally control the phase alignment between the first output signal and the second output signal based on continuous determination of the phase difference information and the control information, until the first output signal is phase aligned with the second output signal.

8. The system according to claim 7, wherein the incremental control of the phase alignment corresponds to a specific number of steps taken for the determination of the phase difference information, determination of the control information, and the control of the at least one of the reference buffer, the phase detector and charge pump, the phase shifter, or the delta sigma ($\Delta\Sigma$) modulator of the one of the plurality of PLL circuits, to achieve the phase alignment between the first output signal and the second output signal.

9. The system according to claim 1,
   wherein each of the reference buffer, the phase detector and charge pump, the phase shifter, and the delta sigma ($\Delta\Sigma$) modulator corresponds to a register, and
   wherein the control information corresponds to a value entered in the register, related to the at least one of the reference buffer, the phase detector and charge pump, the phase shifter, or the delta sigma ($\Delta\Sigma$) modulator, to further control the phase alignment.

10. The system according to claim 1, further comprising a digital synchronizer configured to:
   receive the reference frequency signal, and
   time synchronize the control of the at least one of the reference buffer, the phase detector and charge pump, the phase shifter, or the delta sigma ($\Delta\Sigma$) modulator in each of the plurality of PLL circuits based on the determined control information and the received reference frequency signal.

11. The system according to claim 1, wherein the at least one processor is further configured to:
   retrieve threshold information stored in a memory;
   compare the determined phase difference information with the retrieved threshold information; and
   control the phase alignment between the first output signal and the second output signal based on the comparison.

12. The system according to claim 11, wherein the at least one processor is further configured to:
   update the threshold information based on the control of the phase alignment between the first output signal and the second output signal, and
   store the updated threshold information in the memory.

13. The system according to claim 1, wherein the at least one processor is further configured to periodically trigger the control of the phase alignment between the first output signal and the second output signal at a specific time interval.

14. The system according to claim 1, wherein the at least one processor is further configured to:
   determine temperature change information, and
   trigger the control of the phase alignment between the first output signal and the second output signal based on the determined temperature change information.

15. The system according to claim 1, wherein the at least one processor is further configured to:
   determine an operating channel frequency of the system, determine the control information based on the determined phase difference information and the determined operating channel frequency, and
   control the phase alignment between the first output signal and the second output signal based on the determined control information.

16. The system according to claim 1, wherein the at least one processor is further configured to:
   determine an operating temperature of the system,
   determine the control information based on the determined phase difference information and the determined operating temperature, and
   control the phase alignment between the first output signal and the second output signal based on the determined control information.

17. The system according to claim 1, wherein the plurality of PLL circuits are connected in parallel.

18. The system according to claim 1, wherein the plurality of PLL circuits are serially connected.

19. A method, comprising:
   in a system including a plurality of phase-locked loop (PLL) circuits,
      wherein each of the plurality of PLL circuits includes a reference buffer, a phase detector and charge pump, a phase shifter, and a delta sigma ($\Delta\Sigma$) modulator, and
      wherein each of the plurality of PLL circuits is configured to receive a reference frequency signal and output a plurality of output signals:
      determining phase difference information between a first output signal of the plurality of output signals of one of the plurality of PLL circuits and a second output signal of the plurality of output signals of other of the plurality of PLL circuits,
      determining control information based on the determined phase difference information between the first output signal and the second output signal,
      controlling at least one of the reference buffer, the phase detector and charge pump, the phase shifter, or the delta sigma ($\Delta\Sigma$) modulator of the one of the plurality of PLL circuits based on the determined control information, and
      controlling phase alignment between the first output signal of the one of the plurality of PLL circuits and the second output signal of the other of the plurality of PLL circuits based on the control of the at least one of the reference buffer, the phase detector and charge pump, the phase shifter, or the delta sigma ($\Delta\Sigma$) modulator.

20. An electronic device, comprising:
   at least one processor coupled to a plurality of phase-locked loop (PLL) circuits,
      wherein each of the plurality of PLL circuits includes a reference buffer, a phase detector and charge pump, a phase shifter, and a delta sigma ($\Delta\Sigma$) modulator,
      wherein each of the plurality of PLL circuits is configured to receive a reference frequency signal and output a plurality of output signals; and
      wherein the at least one processor is configured to:
         determine phase difference information between a first output signal of the plurality of output signals of one of the plurality of PLL circuits and a second output signal of the plurality of output signals of other of the plurality of PLL circuits,
         determine control information based on the determined phase difference information between the first output signal and the second output signal, control at least one of the reference buffer, the phase detector and charge pump, the phase shifter, or the delta sigma ($\Delta\Sigma$) modulator of the one of the plurality of PLL circuits based on the determined control information, and control phase alignment between the first output signal of the one of the plurality of PLL circuits and the second output signal of the other of the plurality of PLL circuits based on the control of the at least one of the reference buffer, the phase detector and charge pump, the phase shifter, or the delta sigma ($\Delta\Sigma$) modulator.

\* \* \* \* \*